United States Patent
Yamashita et al.

(10) Patent No.: US 9,534,923 B2
(45) Date of Patent: Jan. 3, 2017

(54) SENSOR DEVICE WITH SAMPLING FUNCTION, AND SENSOR DATA PROCESSING SYSTEM USING SAME

(75) Inventors: Masaya Yamashita, Tokyo (JP); Shiro Kobayashi, Tokyo (JP); Osamu Koizumi, Tokyo (JP); Yuko Akagi, Tokyo (JP)

(73) Assignee: Asahi Kasei Microdevices Corporation, Tokyo (JP)

( * ) Notice: Subject to any disclaimer, the term of this patent is extended or adjusted under 35 U.S.C. 154(b) by 440 days.

(21) Appl. No.: 14/344,617

(22) PCT Filed: Feb. 24, 2012

(86) PCT No.: PCT/JP2012/001275
§ 371 (c)(1),
(2), (4) Date: Mar. 13, 2014

(87) PCT Pub. No.: WO2013/124903
PCT Pub. Date: Aug. 29, 2013

(65) Prior Publication Data
US 2014/0350894 A1 Nov. 27, 2014

(51) Int. Cl.
*G01C 23/00* (2006.01)
*H03K 21/02* (2006.01)
(Continued)

(52) U.S. Cl.
CPC ............... *G01C 23/00* (2013.01); *G01C 19/00* (2013.01); *G01C 21/10* (2013.01); *G01D 21/00* (2013.01); *H03K 21/023* (2013.01); *H03K 21/38* (2013.01)

(58) Field of Classification Search
CPC ............... G01C 123/00; G01C 23/00
(Continued)

(56) References Cited

U.S. PATENT DOCUMENTS 5,016,186 A * 5/1991 Toyoda .............. G05B 23/0232
702/56
5,832,420 A 11/1998 Yuhara et al.
(Continued)

FOREIGN PATENT DOCUMENTS

DE 10119396 A1 10/2002
JP H09-089598 A 4/1997
(Continued)

OTHER PUBLICATIONS

Supplemental European Search Report issued in corresponding European Patent Application No. 12869414.8 dated Feb. 2, 2015.
International Search Report issued in corresponding International Patent Application No. PCT/JP2012/001275 dated May 15, 2012.

*Primary Examiner* — Bryan Bui
(74) *Attorney, Agent, or Firm* — Morgan, Lewis & Bockius LLP

(57) ABSTRACT

The sensor device includes a counter for counting the number of count commands used to perform measurements while maintaining among multiple sensor devices the ratio of measurement intervals; a ratio-holding-unit for setting the ratio to a desired ratio and holding respective values of the ratio for each of the multiple sensor devices; a sampling-timing-generating-unit for receiving a count value of the counter and the setting value of the ratio held by the ratio-holding-unit, and for generating a sampling timing signal based on the comparison result between the count value and the setting value; and a sampling-unit for sampling a detection signal detected by the detecting unit, by using the sampling timing signal generated by the sampling-timing-generating-unit.

13 Claims, 31 Drawing Sheets

(51) Int. Cl.
  *H03K 21/38* (2006.01)
  *G01C 19/00* (2013.01)
  *G01C 21/10* (2006.01)
  *G01D 21/00* (2006.01)

(58) Field of Classification Search
  USPC ........................................................ 702/189
  See application file for complete search history.

(56) References Cited

U.S. PATENT DOCUMENTS

| | | |
|---|---|---|
| 6,467,347 B1 | 10/2002 | Fujimoto |
| 2001/0029431 A1 | 10/2001 | Ito |
| 2003/0004620 A1 | 1/2003 | Yamashita |
| 2009/0198444 A1 | 8/2009 | Takanashi et al. |
| 2011/0022318 A1 | 1/2011 | Zhao et al. |

FOREIGN PATENT DOCUMENTS

| | | |
|---|---|---|
| JP | 2001-188011 A | 7/2001 |
| JP | 2001-280974 A | 10/2001 |
| JP | 2003-014462 A | 1/2003 |
| JP | 2003-057077 A | 2/2003 |
| JP | 2009-204603 A | 9/2009 |
| JP | 2010-127857 A | 6/2010 |
| JP | 2012-047585 A | 3/2012 |
| WO | 2007/009458 A2 | 1/2007 |

* cited by examiner

SENSOR DEVICE WITH SAMPLING FUNCTION, AND SENSOR DATA PROCESSING SYSTEM USING SAME

TECHNICAL FIELD

The present invention relates to a sensor device with sampling functionality and a sensor data processing system using the sensor device with the sampling function. To be more specific, the present invention relates to a sensor device with sampling functionality which allows a ratio of measurement interval in the respective sensor devices to be arbitrarily set and held and which can autonomously perform measurement while holding the set ratio of measurement interval in the respective sensor devices, and a sensor data processing system using the sensor device.

BACKGROUND ART

Today, sensor data from multiple sensor devices is widely used. Various sensor devices such as gyroscopes and magnetometers are actually used in high-performance mobile equipment such as smart phones. Moreover, research is made on techniques such as a dead-reckoning (DR) technique in which multiple pieces of sensor data are integrated to perform position estimation, which is applicable to navigation systems. Thus, there is a need for techniques for integrally processing sensor data from multiple sensor devices.

In integral processing of multiple sensor devices as described above, in order to operate the sensor devices at low power consumption without interfering with the use of the user, it is important to reduce the load on an integral-processing-unit which obtains and processes the sensor data and to avoid unnecessary or inefficient measurements by performing optimal measurement management for each of the sensor devices.

For example, Patent Literature 1 discloses a sensor device which autonomously operates independent of an integrated processing-unit to reduce the load on the integrated-processing-unit.

FIG. 1 is a configuration diagram of a conventional GPS receiver with a DR sensor sampling function. The GPS receiver of FIG. 1 is the GPS receiver described in Patent Literature 1. This GPS receiver has a GPS positioning function as well as other functions required as a car navigation system. This GPS receiver can also provide information to a CPU (central processing unit) in a form easy to use. The GPS receiver in FIG. 1 includes: a GPS antenna 8; the CPU 10; a gyroscope 12; filters 14 and 16; the GPS receiver 20; a controlling-unit 22; an A/D converter 24; a counter 26; and a navigation system 100.

The GPS receiver described in Patent Literature 1 includes: sampling means for sampling DR sensor signals such as a gyroscope, a vehicle speed pulse, and a reverse signal at predetermined cycles; and controlling means for outputting multiple pieces of sampling data sampled by the sampling means together with a GPS position calculated at predetermined cycles, as one frame of data, every cycle in which the GPS position is calculated. In the case where the controlling means outputs one frame of data as serial data, the CPU only controls a serial interface to obtain the sampling data of the DR sensors together with the GPS position.

In other words, in the GPS receiver described in Patent Literature 1, the sensor devices independent of the CPU manage the data measurements by the sensor devices and transmit data in one set to the CPU to reduce the processing of the integrated-processing-unit which has been conventionally implemented by the CPU. Moreover, the GPS receiver performing measurements at a first measurement rate (low) has the controlling-unit which manages the data measurements by the devices for DR at a second measurement rate (high), and transmits data in one set to the CPU at the first measurement rate.

In a system in Patent Literature 1, instead of the CPU, a device to be a main device controls and manages the data measurements by sensor devices. Accordingly, the sensor devices can perform data measurements while being synchronized at a desired measurement rate (the number of measurements within a particular period of time), without increasing the load on the CPU. However, in the technique in Patent Literature 1, the functions of the CPU are merely alternatively implemented by the main device and a specific device with functions of controlling and managing data measurements is necessary. Thus, the sensor devices connected to the main device cannot autonomously operate.

There are, as sensor devices capable of full autonomous operation, sensor devices which have independent clock and performs autonomous measurements. Such sensor devices can thereby perform autonomous measurements at respectively set measurement rate, without putting a load on the CPU. However, such sensor devices have a problem that, since such sensor devices operate by independent clocks, measurement timing (output time at which measurement data is output to the CPU) deviates from one such sensor device to another, and hence the sensor devices cannot synchronize each other.

In view of this, there are recently another type of sensor devices which performs autonomous measurements synchronized with a measurement timing by receiving a trigger from outside the device.

For example, a magnetic sensor described in Patent Literature 2 is a magnetic sensor capable of performing synchronized samplings among each detecting-units (sensors) by detecting a trigger from the outside.

FIG. 2 is a block diagram for explaining the magnetic sensor described in Patent Literature 2. A magnetic sensor 9 in FIG. 2 corresponds to magnetic sensors 9a and 9b. The magnetic sensor 9 includes multiple magnetism-detecting-units 11a to 11c, sampling-process-units 17a to 17c, a trigger-detecting-unit 13, and a hold-process-unit 19. Detection signals from the multiple magnetism-detecting-units 11a to 11c are subjected to sampling processes by the sampling-process-units 17a to 17c, respectively. Moreover, the signals subjected to the sampling processes by the sampling-process-units 17a to 17c are inputted to the hold-process-unit 19, held until the next signals are inputted, and appropriately outputted to the outside. Moreover, the sampling-process-units 17a to 17c are driven in synchronization with an external trigger signal inputted to the trigger-detecting-unit 13 to perform sampling only once. Moreover, drive circuits of the magnetic sensors 11a to 11b can be also driven in synchronization with the external trigger signal inputted to the trigger-detecting-unit 13. Note that the magnetic sensor 9 includes a controlling-unit 15.

Such a technique allows multiple sensor devices to perform measurements synchronized with a measurement timing, without putting a load on CPU. There is a technique in which multiple sensor devices having the same measurement rate perform synchronized measurements among the sensor devices with a measurement timing as in aforementioned Patent Literature 2. However, in reality, different measurement rates and/or measurement timings are frequently required among different types of sensor devices. Measurement rates and/or measurement timings often vary among different types of sensor devices for power saving, for optimization, or due to difference in time required for measurements. Thus the measurement timings of the sensor devices can easily deviate from each other. Thus, in a case where multiple sensor devices are to be integrally processed, a correction process needs to be performed to correct deviations in measurement timing and associate each data sample. Patent Literature 3 can be given as an example. In Patent Literature 3, process timing of sensor devices are matched each other by setting respective delay time for each sensor according to their deviations in measurement timing.

Generally, in a vehicle navigation device, an optimal current position is estimated by combining a position calculated by a dead reckoning method and a position calculated by a GPS (Global Positioning System). In the dead reckoning method, a current position is calculated by updating a previous measured position on the basis of a speed pulse indicating the speed of the vehicle and a turn angle velocity of the vehicle measured by a gyroscope, i.e. an angular velocity sensor. In a navigation system employing such a method, the position of the vehicle can be derived by the dead reckoning method even in a tunnel, an underground parking lot, or an area between high buildings, where reception of radio waves from GPS satellites is difficult. However, this is only possible under the assumption that the moving distance from the speed pulse and the angular velocity from the gyroscope, i.e. the bearing are correctly obtained respectively.

The navigation device described in aforementioned Patent Literature 3 is related to a navigation system configured to derive the angular velocity of a moving object on the basis of an output value of an gyroscope attached in a moving object and a function for conversion from the output value of the gyroscope to the angular velocity. The navigation device includes a measuring-unit configured to periodically measure measurement data including at least the bearing of the moving direction and the moving speed, on the basis of signals received from satellites, and adjusts an output timing of an output value of the gyroscope in such a way that the output timing matches the measurement timing of the measurement data in the measuring-unit. The navigation device described above is a device which, in this case, adjusts the output timing of the output value of the gyroscope according to an error between the detection timing of the output value of the gyroscope and the measurement timing of the measurement data and thereby reduces the error between the detection timing and the measurement timing.

However, in the navigation device in Patent Literature 3, there is a need to calculate the delay time for correcting the deviation in measurement timings in advance through experiments and set the delay time. Thus, this method has a problem that it is not versatile.

CITATION LIST

Patent Literature

PTL 1: Japanese Patent Laid-Open No. 2001-280974
PTL 2: Japanese Patent Laid-Open No. 2010-127857
PTL 3: Japanese Patent Laid-Open No. 2009-204603

SUMMARY OF INVENTION

As explained in the aforementioned description of Patent Literatures 1 to 3, in the case of integrally processing sensor data from multiple sensor devices, it is important to perform measurements at respective optimal measurement rates for each sensor devices as well synchronized each other, and to reduce processing load on the integral-processing-unit of sensor data.

After this paragraph in the specification, the word "synchronization" in the context of measurement timing has actually two perspectives. In the present invention, these two perspectives are used, clearly distinguished from each other. First, there is a perspective of 1) avoiding deviation in the ratio of measurement intervals among sensor devices, whose ratio is set based on the measurement rates for each sensor devices. In other words, a ratio in the number of measurements is kept, so that, for example, one sensor device always performs measurements m times while another performs measurements n times. Avoiding a deviation in the ratio of measurement intervals enables accurate association of data samples among different sensor devices, hence is a crucial perspective to integrally process sensor data from multiple sensor devices. Next, there is another perspective of 2) performing measurements on multiple sensor devices simultaneously at the same time. "Synchronization" described in Patent Literatures 2 and 3 are based on this perspective. It is not always good for a measurement timing for different sensor devices to be exactly at the same time. In a case where multiple sensor devices are used, measurements are sometimes desired to be performed with their timing deliberately shifted from one another. For example, in a case of multiple sensor devices which interfere with one another if measurements are performed simultaneously, the interference can be prevented by shifting the measurement timings. Moreover, in a case where all of the sensor devices are simultaneously used to perform measurements, a large amount of electric current flows and a noise tends to occur. However, shifting the timings of the measurements can suppress the amount of electric current used at one time and also smooth an electric current value at the same time. Accordingly, the noise can be reduced to a lower level.

As described above, out of the two perspectives of the word "synchronization" in the context of measurement timing, the perspective of keeping the ratio of measurement intervals among sensor devices is particularly important. Hence, in the following description of the present invention unless otherwise stated, "synchronization" is used in the meaning of performing measurements in such a way that no deviation in the ratio of measurement intervals, whose ratio is set based on the measurement rates for each sensor devices.

A term "sampling" is used in the description of the present invention, and "sampling" has also two perspectives when thinking about over sampling technique, which is frequently used in sensor devices. First, there is a sampling in which 1) an analog signal is sampled and held at an input of an analog-to-digital converter. This is referred to as "sampling in AD conversion". Then, 2) a series of time-discrete signals of an AD conversion output is thereafter sampled at time intervals different from the sampling in AD conversion. This is referred to as "sampling at data collection".

In the present invention, the use of "sampling" intends to mean "sampling at data collection" unless otherwise stated. In a case where the over sampling technique is not used, the sampling in AD conversion and the sampling in data collection are identical. In the present invention, it is described above that the perspective of keeping the ratio of measurement intervals is important. The ratio of measurement intervals in the present invention is considered as the ratio of measurement intervals of "sampling at data collection".

Thus on processing the sensor data from multiple sensor devices integrally, the following three points are important and to be major problems:

<1> performing measurements at respective measurement rate optimal for each sensor devices;

<2> performing measurement while keeping the ratio of measurement intervals among sensor devices which ratio is set based on the measurement rates for each sensor devices; and <3> reducing processing load on the integrated-processing-unit for the sensor data.

FIG. 3 discloses a technique of a type of sensor device with sampling function in the expectation of explaining the problems to be solved by the present invention. FIG. 3 is a configuration diagram of a sensor data processing system in which a CPU has a function of managing measurement timings of multiple sensor devices.

The sensor data processing system includes a sensor apparatus 30 which consists of multiple sensor devices 31, 32, and 33; and a CPU 35 for processing measurement data from the sensor apparatus 30. The first sensor device 31 receives measurement-start command from outside the device, and consists of a detecting-unit 311, a measuring-unit 312 which starts a measurement of the output from the detecting-unit 311 upon receiving a measurement-start command from the outside, and a measurement result-holding-unit 313 which holds a measurement result of the measuring-unit 312 and transmits the measurement data to the CPU 35. The second sensor device 32 and the third sensor device 33 also have the same configuration as that of the first sensor device 31.

In this configuration, first, the CPU 35 issues a measurement-start command to the first sensor device 31 and the first sensor device 31 starts a measurement. The CPU 35 reads a measurement result held in the measurement result-holding-unit 313 of the first sensor device 31 as measurement data. Then, the CPU 35 issues a measurement-start command to the second sensor device 32 and the second sensor device 32 starts a measurement. The CPU 35 reads measurement data from the second sensor device 32. Finally, the CPU 35 issues a measurement-start command to the third sensor device 33 and the third sensor device 33 starts a measurement. The CPU 35 reads measurement data from the third sensor device 33. The measurement data from the multiple sensor devices 31, 32, and 33 are thus processed by the CPU 35. Here, the timings to access each sensor devices are managed based on respective measurement rates for each sensor devices.

As described above, a system in which the CPU manages the measurement timings of multiple sensor devices operates as follows: each of the sensor devices performs a measurement upon receiving a command from the outside; and the CPU manages the measurement timings according to respective measurement rate set for each sensor devices; and the CPU collects data by accessing the sensor devices at appropriate timings. Such a system has a problem that processing load on the CPU, which is responsible for all of the functions of the integral processing unit, is large. Thus, although the problems <1> and <2> described above can be solved, the problem <3> cannot be solved.

FIG. 4 shows a technique of another type of sensor device with sampling functionality in the hope of explaining the problems to be solved by the present invention. FIG. 4 is a configuration diagram of an autonomous measurement managing system which includes sensor apparatus having independent clocks and performs autonomous measurements, and requires accordingly no measurement timing management by a CPU.

This autonomous measurement managing system includes a sensor apparatus 40 which consists of multiple sensor devices 41, 42, and 43 and a CPU 45 for processing measured data from the sensor apparatus 40. The first sensor device 41 starts a measurement on the basis of its clock, and consists of a clock-generating-unit 414, a counter 415 for counting clocks from the clock-generating-unit 414, and a comparator 416 for comparing a value set by a register-setting-unit 417 and a count value of the counter 415. The sensor device 41 also includes a measurement-start-command-generating-unit 418 for generating a measurement-start command by using a comparison value from the comparator 416, a measuring-unit 412 for starting a measurement of output from a detecting-unit 411 upon receiving a measurement-start command from the measurement-start-command-generating-unit 418, and a measurement-result-holding-unit 413 for holding a measurement result (including a measurement completion notification) of the measuring-unit 412 and transmitting a measurement data to the CPU 45. The second sensor device 42 and the third sensor device 43 also have the same configuration as the first sensor device 41.

This configuration allows each of the sensor devices 41, 42, and 43 to operate by itself to perform measurements and generate an interrupt signal upon completion of a desired number of measurements. The CPU 45 obtains the measurement data on the basis of the interrupt signal from each of the sensor devices 41, 42, and 43.

As described above, the autonomous measurement managing system in which each sensor devices have independent clock and performs autonomous measurements operates as follows: each of the sensor devices operates and performs measurement by itself on the basis of its own clock, and generate an interrupt signal upon completion of the desired number of measurements; the CPU obtains the measurement data by accessing corresponding sensor device on the basis of interrupt signal from each sensor devices. In such a system, since each of the sensor devices is responsible for many of the functions of the integrated-processing-unit, processing load on the CPU can be reduced. Measurements can be performed also with an optimal measurement rate set for each sensor devices.

However, the autonomous measurement managing system has the following problem: i.e., since each sensor device operates based on its independent clock, deviation of the ratio of measurement intervals among sensor devices can increase along elapsed time. This problem occurs because clock frequency varies from a sensor device to another, hence even though the sensor devices are set to operate at the same measurement rate, measurement intervals can deviate from each other.

FIG. 5 illustrates a case where, measurement intervals do not match each other due to variations in the clocks of sensor devices even if the same sensor devices are set to the same measurement rate. For example, if measurements are performed at the measurement rate of 100 Hz by using 1 kHz clocks each of which runs with an error of plus or minus 1%, the measurement timings can deviate by up to plus or minus 10 msec, i.e., one measurement, after one second. This deviation is accumulated and increases as time elapses. Accordingly, although the problems <1> and <3> described above can be solved, the problem <2> cannot be solved.

Then, consider a case where the sensor devices described in aforementioned Patent Literature 2 are used. In this case, multiple sensor devices can autonomously perform sampling by referring to the same trigger signal. Accordingly, the ratio of measurement intervals in each sensor devices does not deviate as time elapses. In addition, processing load on the integrated-processing-unit for the sensor data can be also reduced. However, Patent Literature 2 has a problem that each of the sensor devices cannot perform sampling at respective optimal measurement rate to achieve low power consumption. In other words, although the problems <2> and <3> described above can be solved, the problem <1> cannot be solved.

As described above, it is difficult to simultaneously solve the aforementioned three important problems of:
<1> performing measurements at respective measurement rate optimal for each sensor devices;
<2> performing measurement while keeping the ratio of measurement intervals among sensor devices which ratio is set based on the measurement rates for each sensor devices; and
<3> reducing processing load on the integrated processing-unit for the sensor data.

An objective of the present invention is to provide a sensor device with sampling functionality which allows the ratio of measurement intervals to be arbitrarily set and held among multiple sensor devices and performs autonomous measurements keeping the set ratio of measurement intervals, and to provide a sensor data processing system using the same.

The present invention has been made to achieve the objective described above, and an invention according to claim 1 is a sensor device with sampling functionality including: a counter for counting the number of count commands which is used to perform measurements while keeping a ratio of measurement intervals among multiple sensor devices; a ratio-of-measurement-interval-holding-unit for holding a setting value of a desired ratio of measurement intervals; sampling-timing-generating-unit for generating a sampling timing signal from a count value of the counter and the setting value of the ratio of measurement intervals which is held in the ratio-of-measurement-interval-holding-unit, on the basis of a result of comparison between the count value and the setting value; and a sampling-unit starting sampling detection signals of various types of information detected by a detecting-unit, according to the sampling timing signal generated by the sampling-timing-generating-unit.

Moreover, an invention according to claim 2 is the invention according to claim 1, wherein delay-time-holding-unit for holding a desired measurement start delay time is connected to the sampling-timing-generating-unit to delay the start of sampling by the sampling-unit according to the sampling timing signal.

Furthermore, an invention according claim 3 is the invention according to claim 1, wherein the sensor device is provided with:
detecting-unit-operation-start-time-holding-unit for holding operation start time information of the detecting-unit; and detecting-unit-operation-controlling-unit for receiving operation start time information of the detecting-unit and the count value respectively from the detecting-unit-operation-start-time-holding-unit and the count value from the counter.

Moreover, an invention according to claim 4 is the invention according to claim 1, wherein the sensor device is provided with count-command-generating-unit for generating the count command, and when using the count command generated by the count-command-generating-unit, the sensor device is capable of outputting the count command to the outside while inputting the count command to the counter.

Furthermore, an invention according to claim 5 is the invention according to claim 4, wherein an interface for outputting the count command generated by the count-command-generating-unit to the outside and an interface for receiving the count command from the outside are a single interface.

Moreover, an invention according to claim 6 is the invention according to claim 5, wherein the interface for outputting the count command generated by the count-command-generating-unit to the outside and the interface for receiving the count command from the outside are the single interface, and the single interface is an I2C bus.

Furthermore, an invention according to claim 7 is the invention according to claim 5, wherein the interface for outputting the count command generated by the count-command-generating-unit to the outside and the interface for receiving the count command from the outside are the single interface, and the single interface is a SPI bus.

Moreover, an invention according to claim 8 is the invention according to claim 5, wherein the sensor device is switchable between an operation mode in which the count command generated by the count-command-generating-unit is inputted to the counter and an operation mode in which the count command received from the outside is inputted to the counter.

Furthermore, an invention according to claim 9 is a sensor data processing system using sensor devices with sampling functionality, wherein the sensor devices according to any one of claims 1 to 8 and a sensor-data-processing-unit are combined, and the sensor-data-processing-unit has a function of setting the ratio of measurement interval and transmitting information on the ratio of measurement interval and the count command to each of the sensor devices and a function of receiving data from the each of the sensor devices.

Moreover, an invention according to claim 10 is a sensor data processing system using sensor devices with sampling functionality, wherein the sensor devices according to any one of claims 1 to 8 and a sensor-data-processing-unit are combined, and a master device connected to the sensor-data-processing-unit has a function of setting the ratio of measurement interval and transmitting information on the ratio of measurement interval and the count command to each of the sensor devices and a function of receiving data from the each of the sensor devices.

Furthermore, an invention according to claim 11 is a sensor data processing system using sensor devices with sampling functionality, wherein the sensor devices according to any one of claims 1 to 8 and a sensor-data-processing-unit are combined, the sensor-data-processing-unit has a function of setting the ratio of measurement interval and the like and transmitting information on the ratio of measurement interval to the respective sensor devices and a function of receiving data from the respective sensor devices, and one of the sensor devices generates and outputs the count command.

Moreover, an invention according to claim 12 is a sensor data processing system using sensor devices with sampling functionality, wherein the sensor devices according to any one of claims 1 to 8 and a sensor-data-processing-unit are combined, the sensor data processing system includes external periodic-signal-generating-unit for generating the count command, the count command is transmitted from the periodic-signal-generating-unit to the sensor devices, and the sensor-data-processing-unit has a function of setting the ratio of measurement interval and transmitting information on the ratio of measurement interval to the respective sensor devices and a function of receiving data from the respective sensor devices.

Furthermore, an invention according to claim 13 is a sensor data processing system using sensor devices with sampling functionality, wherein the sensor devices according to any one of claims 1 to 8 and a sensor-data-processing-unit are combined, the sensor data processing system includes an external periodic-signal-generating-unit for generating the count command, the count command is transmitted from the periodic-signal-generating-unit to the sensor devices and is received by the sensor devices and the respective sensor-data-processing-unit, the sensor respective devices autonomously perform measurements at the set ratio of measurement interval, according to the count command, the sensor-data-processing-unit counts the number of the received count commands and obtains data from the each of the sensor devices when the number of the received count commands reaches a set number.

The present invention can provide a sensor device with sampling functionality which allows the ratio of measurement intervals to be arbitrarily set and held in the multiple sensor devices and which can perform autonomous measurements while maintaining the setting ratio of measurement intervals for each sensor devices, and a sensor data processing system using the sensor device with the sampling functionality.

BRIEF DESCRIPTION OF DRAWINGS

FIG. 3 is a configuration diagram of a measurement timing managing system in which a CPU manages measurement timings of the multiple sensor devices;

FIG. 4 is a configuration diagram of an autonomous measurement managing system which requires no measurement timing management by a CPU and which includes sensor devices having independent clocks and for performing measurements autonomously;

FIG. 18A shows a case where the ratio of measurement interval is 1;

FIG. 18B shows a case where the ratio of measurement interval is 4;

FIG. 26 is a system configuration diagram which shows a case where an I2C bus is used as a single count command input-output interface;

FIG. 27 is a system configuration diagram which shows a case where a SPI bus is used as a single count command input-output interface;

DESCRIPTION OF EMBODIMENTS

Embodiments of the present invention are described below with reference to the drawings.

Embodiment 1

Figure 1:
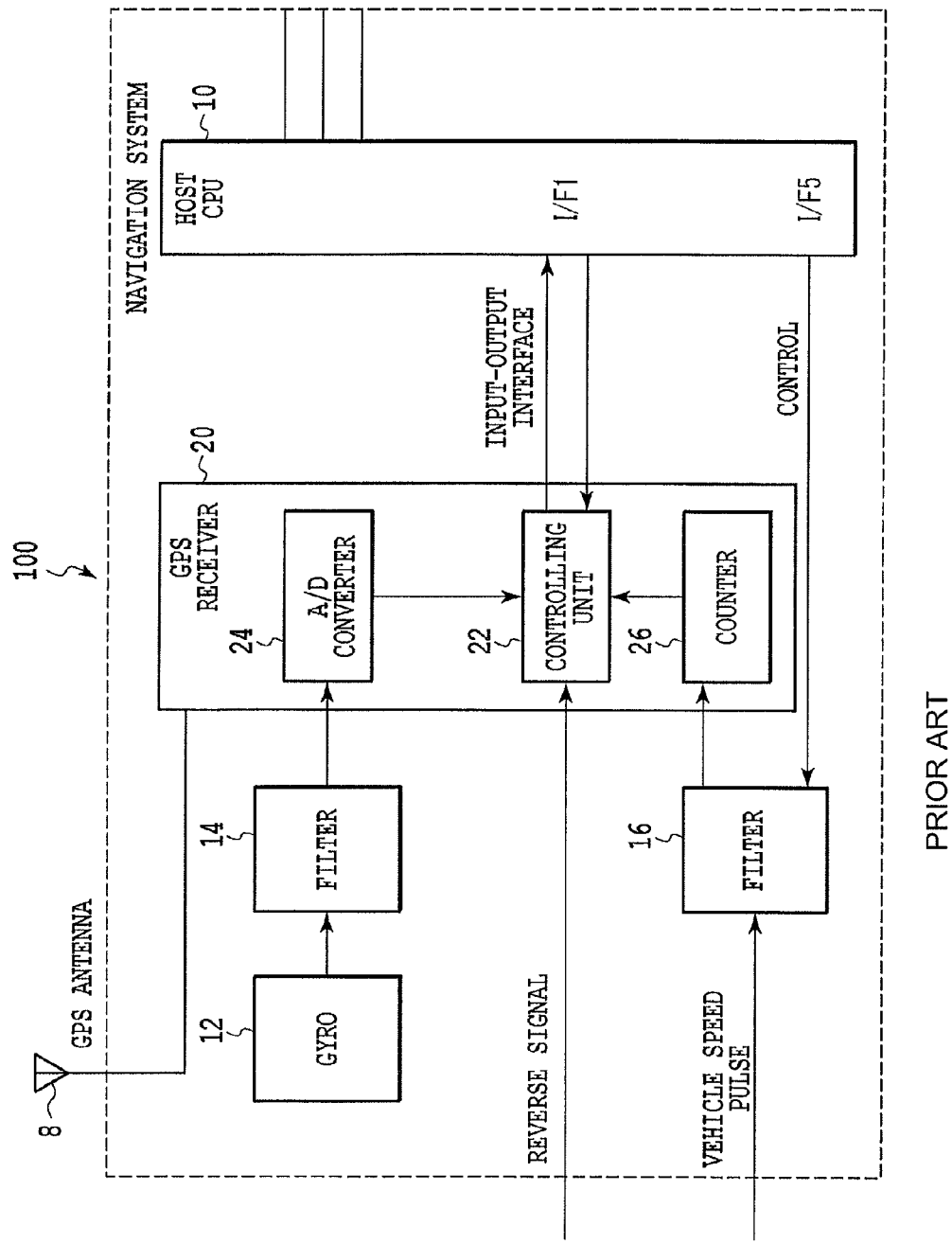
FIG. 1 is a configuration diagram of a conventional GPS receiver with a DR sensor sampling function.
Figure 2:
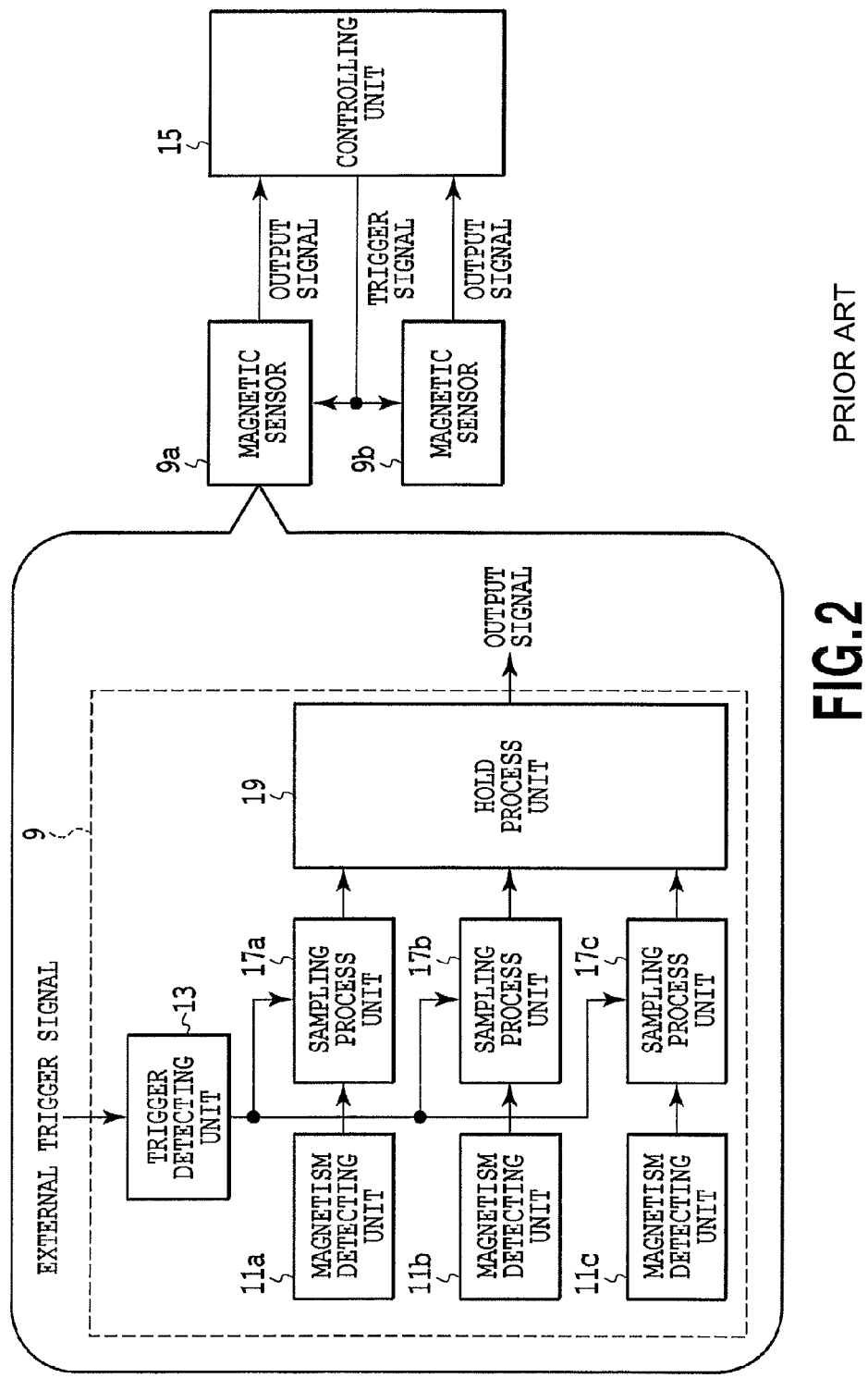
FIG. 2 is a block diagram for explaining a magnetic sensor described in Patent Literature 2.
Figure 3:
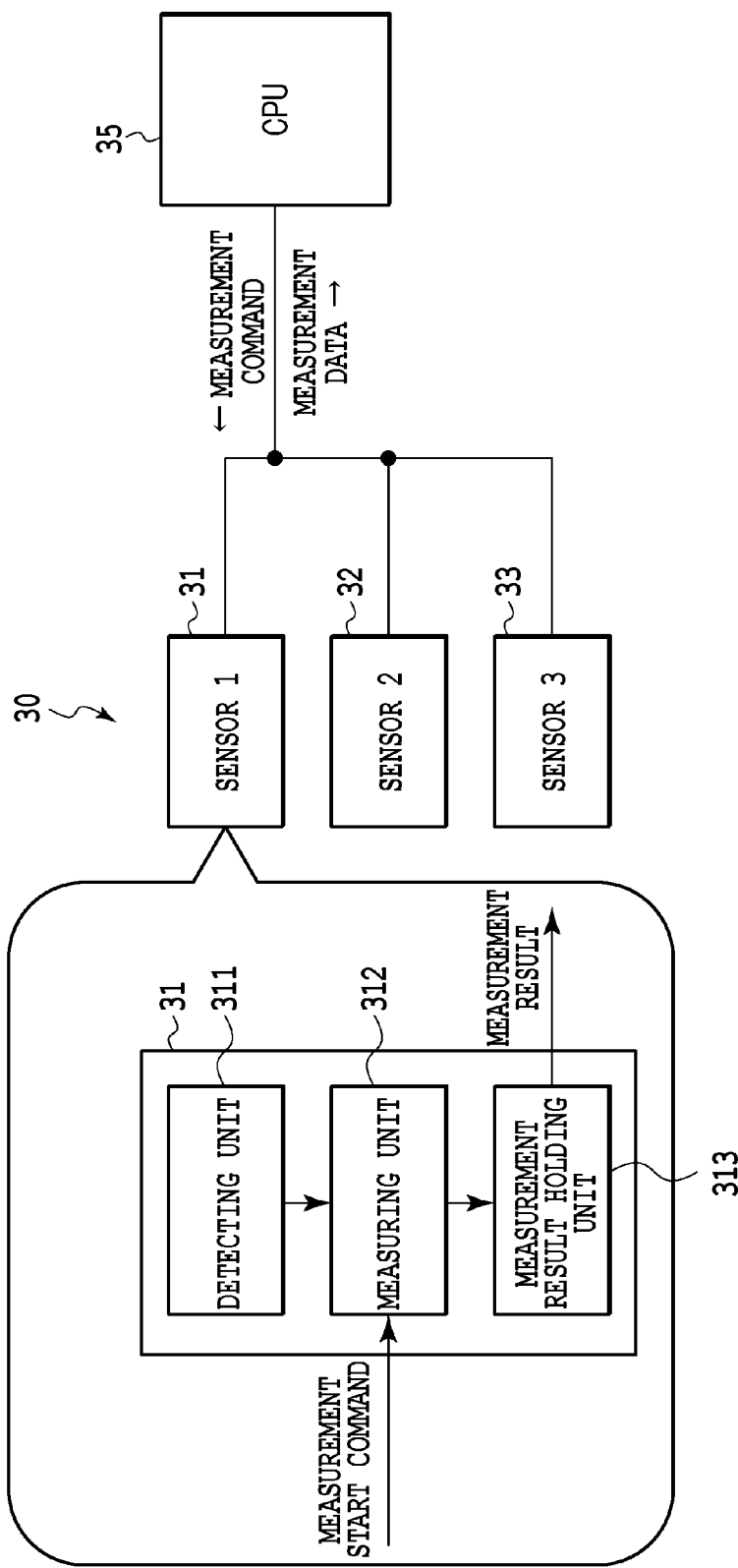
FIG. 3 discloses a technique forming a base of a signal synchronizing device for multiple sensor devices in the present invention.
Figure 4:
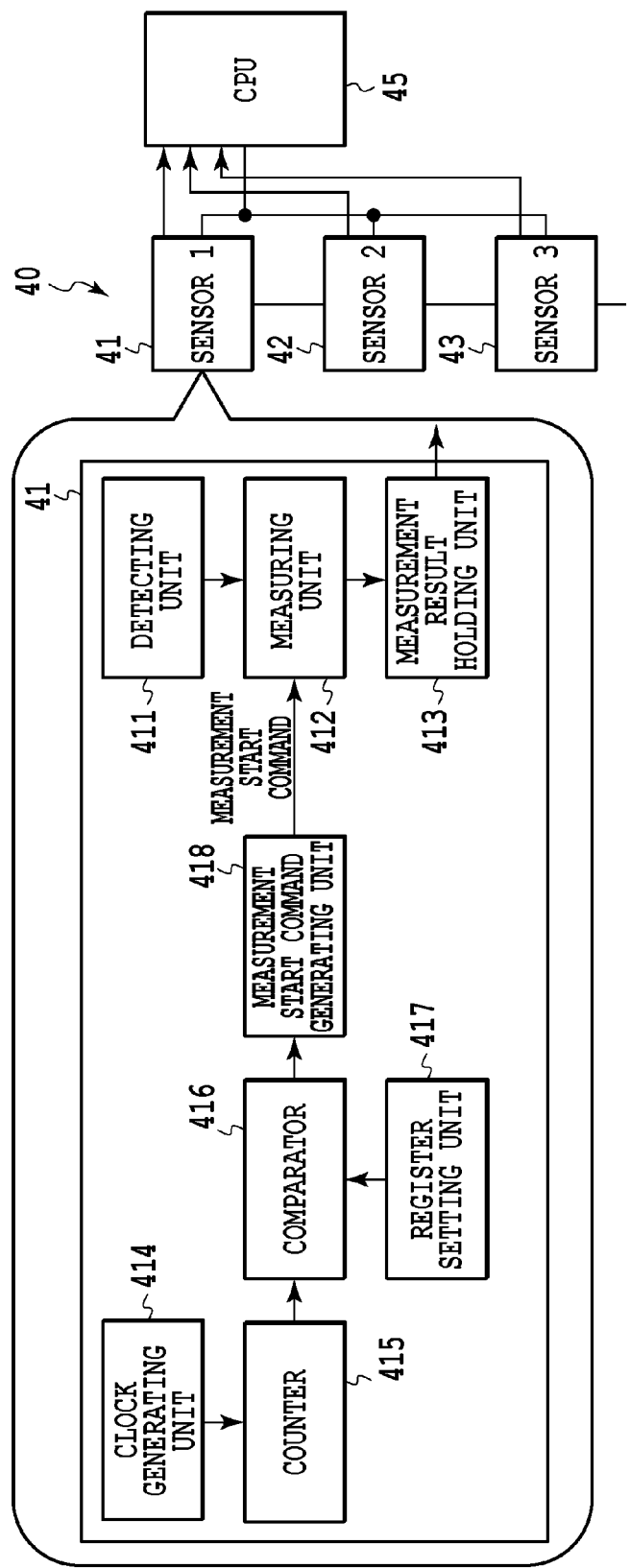
FIG. 4 discloses a technique forming a base of a signal synchronizing device for multiple sensor devices in the present invention.
Figure 5:
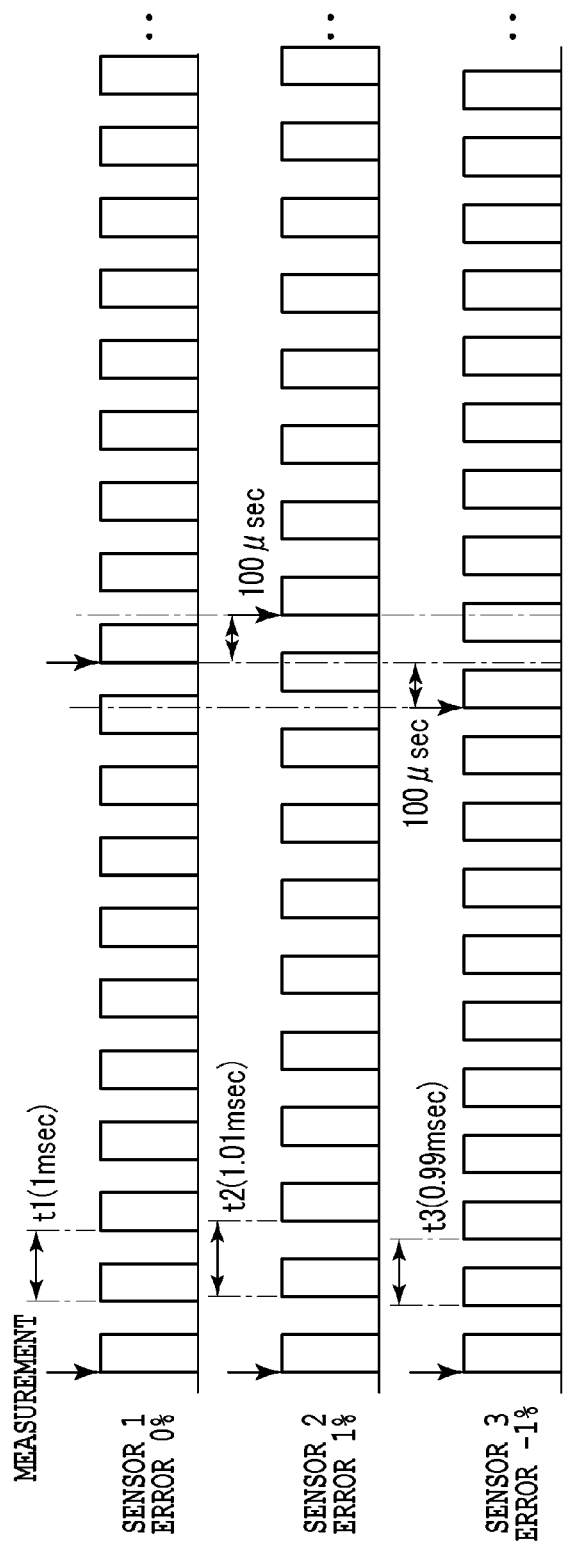
FIG. 5 is an explanatory view of a case where, even if the same sensor devices are set to the same measurement rate, measurement cycles do not match due to deviation caused by variation in clocks of the respective sensor devices, and deviation of a ratio in number of measurements temporally increases.
Figure 6:
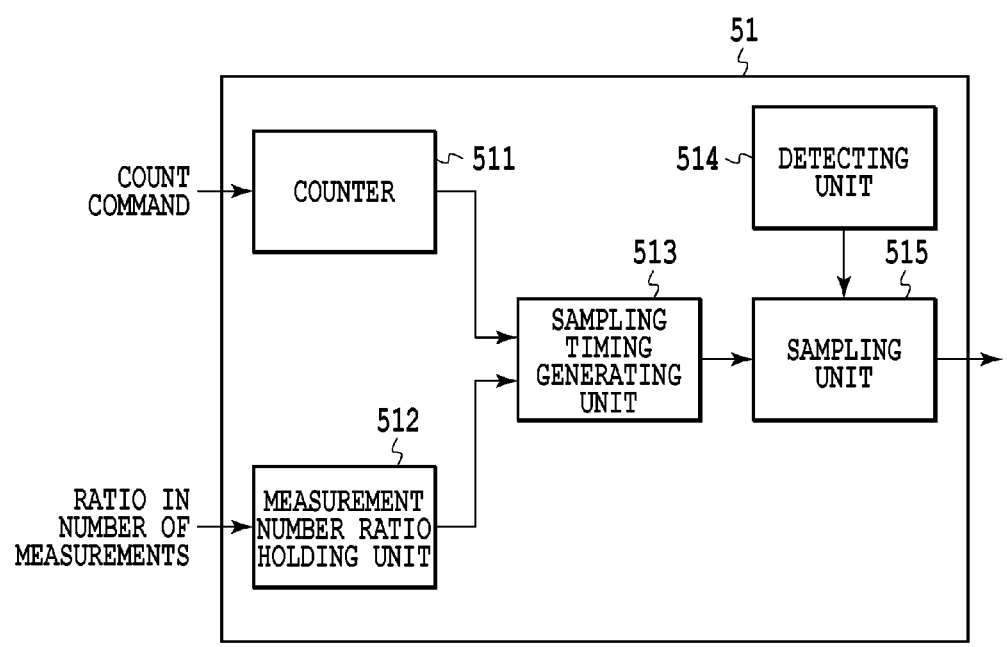
FIG. 6 is a configuration diagram for explaining Embodiment 1 of a sensor device with sampling functionality in the present invention.

FIG. 6 is a configuration diagram for explaining a sensor device with sampling functionality of Embodiment 1 in the present invention. A sensor device 51 in FIG. 6 comprises: a counter 511; a ratio-of-measurement-interval-holding-unit 512; a sampling-timing-generating-unit 513; a detecting-unit 514; and a sampling-unit 515. The sensor device 51 corresponds to the sensor devices 31, 32, and 33 in FIG. 3. The sensor device also corresponds to the sensor devices 41, 42, and 43 in FIG. 4. In FIG. 6, only one sensor device is illustrated.

The sensor device 51 in Embodiment 1 of the present invention includes: the counter 511 for counting the number of count commands which are used to perform measurements while maintaining a ratio of measurement intervals among multiple sensor devices; a ratio-of-measurement-interval-holding-unit 512 for setting the ratio of measurement intervals to a desired ratio of measurement intervals and holding respective values of the ratio of measurement intervals for each of the multiple sensor devices. The sensor device 51 also includes: the sampling-timing-generating-unit 513 for receiving a count value of the counter 511 and the setting value of the ratio of measurement intervals which is held by the ratio-of-measurement-interval-holding-unit 512, and for generating a sampling timing signal based on the comparison result between the count value and the setting value; and the sampling-unit 515 for sampling of detected signals detected by the detecting-unit 514, by using the sampling timing signal generated by the sampling-timing-generating-unit 513. Measurement data from the sensor device 51 is sent to a CPU (not illustrated) and is subjected to signal processing.

Figure 7:
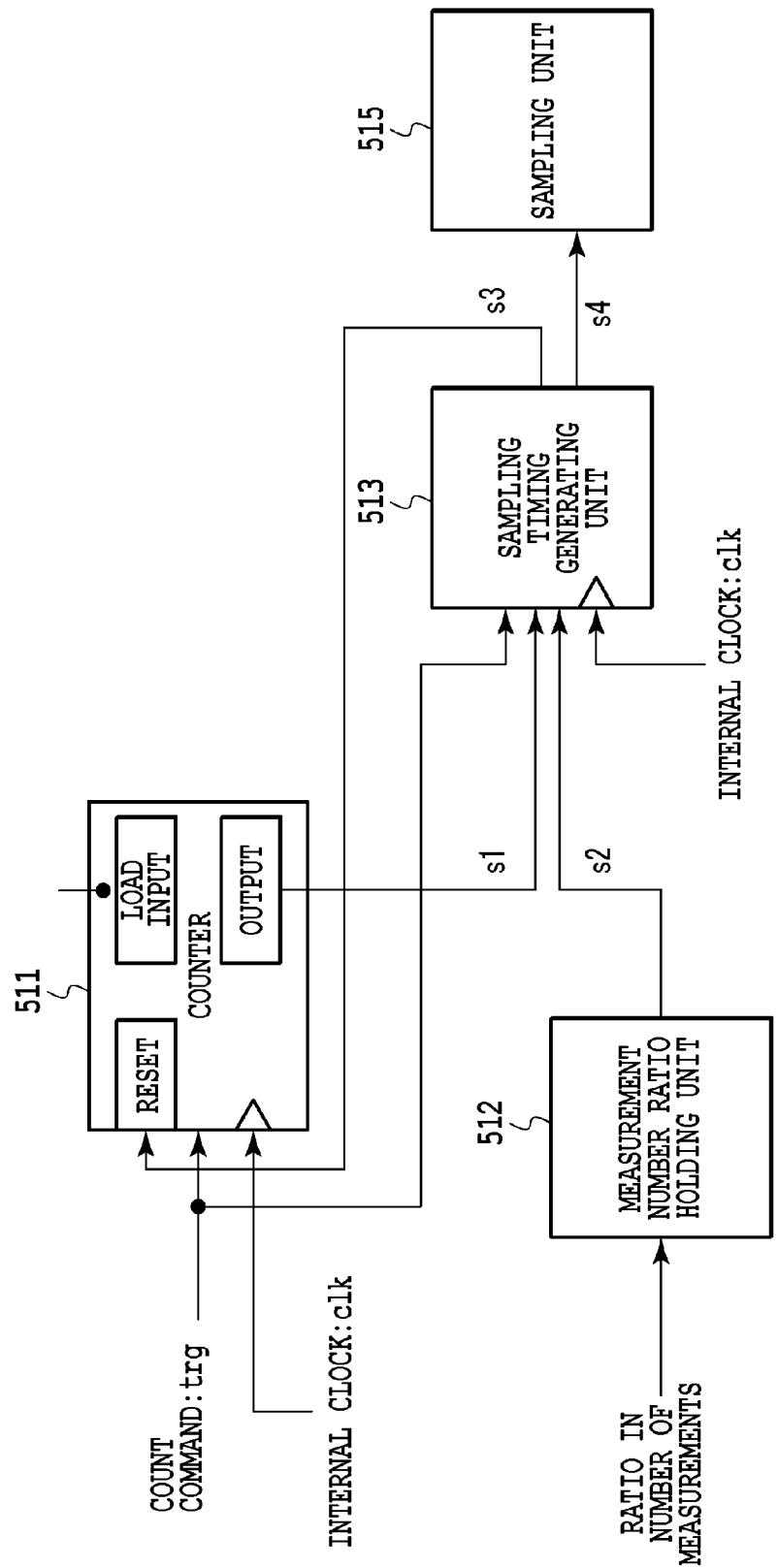
FIG. 7 is a view for explaining flows of signals of respective units in the configuration diagram shown in FIG. 6.
Figure 8:
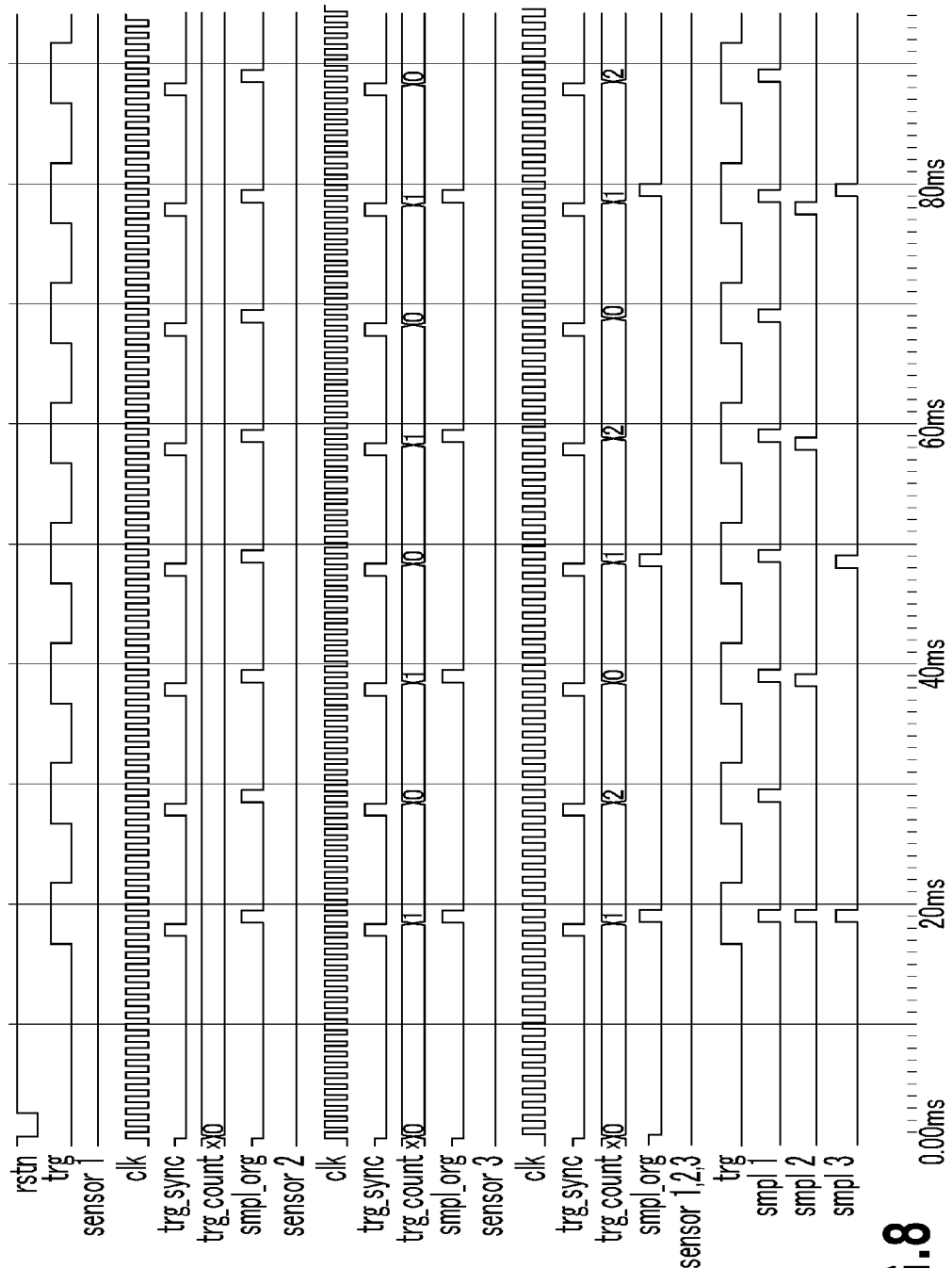
FIG. 8 is a view showing the signals of the respective units in FIG. 7.

FIG. 7 is a view for explaining flows of signals of the respective units in the configuration diagram shown in FIG. 6. FIG. 8 is a view showing the signals of the respective units in FIG. 7. FIG. 8 shows an example of a case where there are multiple sensor devices (sensor1, sensor2, and sensor3). In FIG. 8, two signals (rstn and trg) shown in the top rows are signals commonly inputted from the outside to all of the sensor devices. Next, four signals (clk, trg_sync, trg_count, and smpl_org) shown under each of the partition lines denoted sensor1, sensor2, and sensor3 are internal signals independently held by each of the sensor devices. Lastly, four signals (trg, smpl1, smpl2, and smpl3) shown under the partition line denoted sensor1, 2, 3 are the above-shown signals shown again to facilitate visualization of a state of synchronization among the multiple sensor devices, and trg is the same as trg in the top row while smpl1 to smpl3 are the same as the smpl_org of the sensor devices sensor1 to sensor3, respectively.

Each of the sensor devices operates by using an independent internal clock (clk) of 1 KHz having an accuracy of plus or minus 10%. Moreover, the sensor device 1 holds the value of 1, the sensor device 2 holds the value of 2, and the sensor device 3 holds the value of 3, as the ratio of measurement interval (s2). Furthermore, a common count command (trg) of 100 Hz is inputted to the sensor devices. In this example, the count command is a signal of one bit. Each of the sensor devices fetches the count command by using its internal clock and generates an internal count command (trg_sync) which becomes active for one clock period. Furthermore, a value of the count command counter (trg_count and s1) is incremented by one every time the internal count command becomes active. When the value of the count command counter matches the value of the ratio of measurement interval (s2) minus 1, the value of the count command counter is reset to 0 by a count command counter reset signal (s3). When the internal count command becomes active with the count command counter being reset, an internal basic sampling signal (smpl_org) becomes active for one clock period, and this signal becomes a sampling signal (s4) which is the output of the sampling-timing-generating-unit 513.

This configuration makes it possible to arbitrary set the ratio of measurement interval among multiple sensor devices, and to autonomously perform measurements while maintaining the set ratio of measurement interval among multiple sensor devices.

Figure 10:
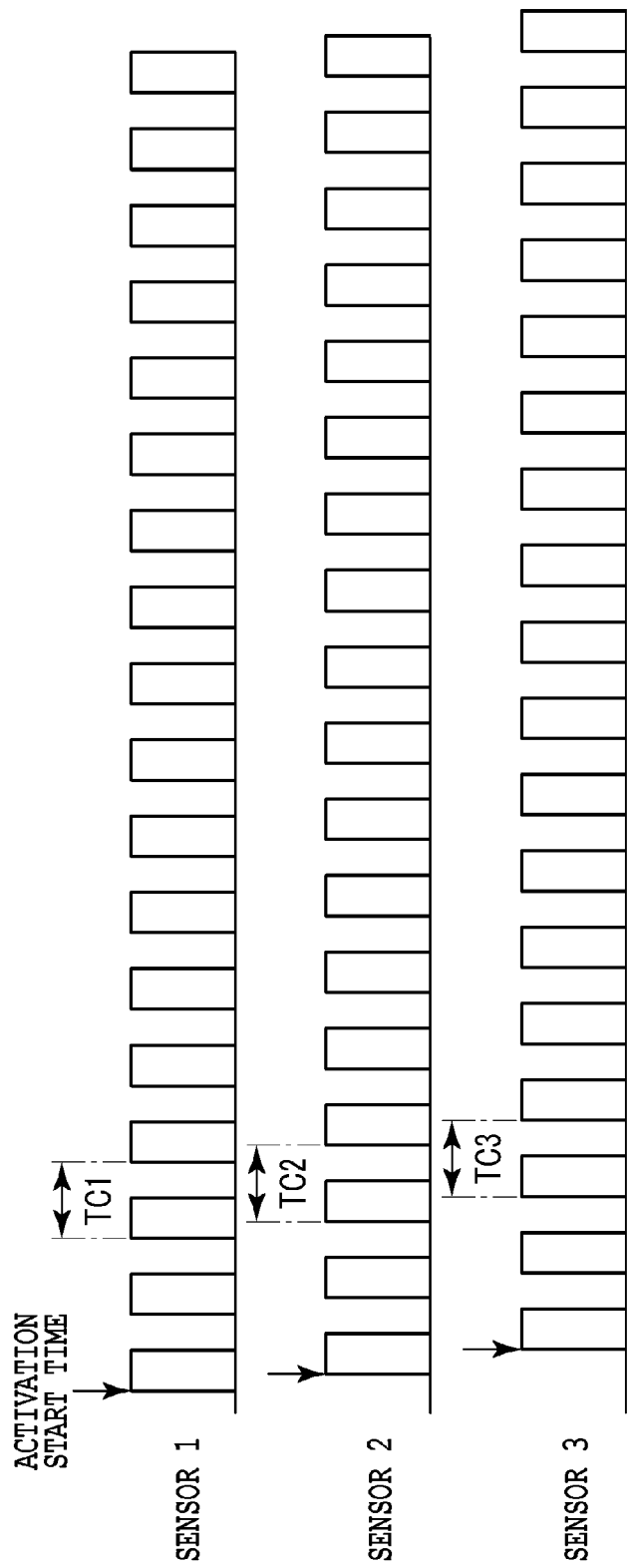
FIG. 10 is an explanatory view of a case where the sensor devices respectively have the clocks of the same rate.

FIG. 10 is an explanatory view of a case where each sensor devices have respective clocks of the same rate. FIG. 10 is a view further explaining the operation of Embodiment 1 by using a simpler drawing. In FIG. 10, the timings at which each sensor devices is activated vary and the periods of the clocks also vary.

Figure 9:
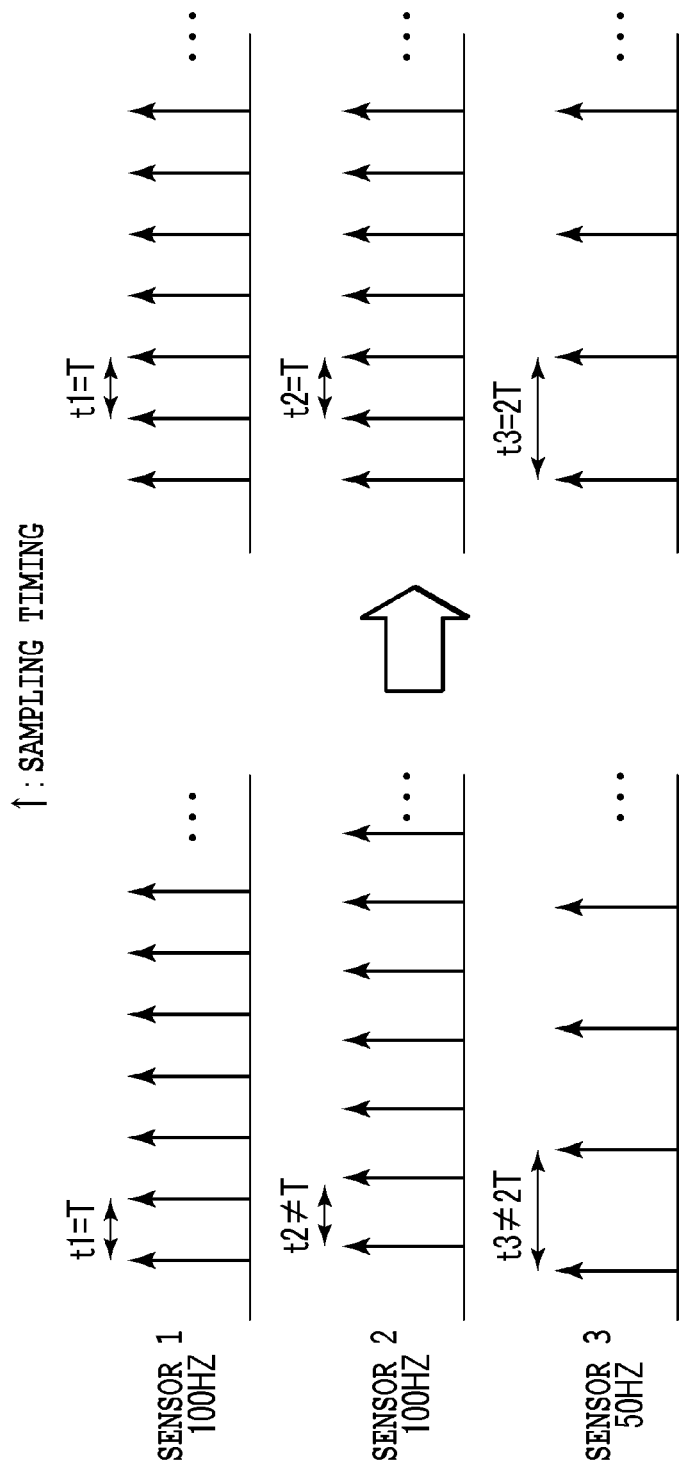
FIG. 9 is an explanatory view of a signal synchronizing device which enables the multiple sensor devices to autonomously perform measurements with holding a set ratio measurement interval in the respective sensor devices.

In Embodiment 1, the ratio of measurement interval of the first sensor device is 1, the ratio of measurement interval of the second sensor device is 1, and the ratio of measurement interval of the third sensor device is 2. Here, if a measurement cycle t1 is set to T in the first sensor device, measurement cycles t2 will be set to T in the second sensor device, and measurement cycles t3 will be set to 2T in the third sensor device. In the sensor devices of the conventional techniques, the variation in clock rate causes a deviation of the measurement cycles. Thus, the measurement cycle t1 is not exactly T, the measurement cycle t2 is not exactly T, and the measurement cycle t3 is not exactly 2T, and the ratio of measurement interval eventually deviates as time elapses. Moreover, in a case where there is a deviation of activation time, the measurement timings also deviate from each other. This state is shown in a left portion of FIG. 9. Even in such a situation, in a case where the processing is performed with the configuration shown in FIG. 6, measurements can be performed with maintaining the measurement cycle t1 at T, measurement cycle t2 at T, and measurement cycle t3 at 2T, as shown in a right portion of FIG. 9 and the ratio of measurement interval in the respective sensor devices does not deviate. Moreover, the measurement timings can be matched among the sensor devices.

As described above, in the configuration of Embodiment 1 as shown in FIG. 6, it is possible to arbitrary set and hold the ratio of measurement interval in the multiple sensor devices and autonomously perform measurements while holding the set ratio of measurement interval in the respective sensor devices.

Embodiment 2

In the aforementioned example of Embodiment 1, the measurements are performed while maintaining the ratio of measurement intervals as well the measurement timings being matched within the range of variations of respective clocks of each sensor devices. However, as described in the problems to be solved by the present invention, a case where measurement timings are deliberately shifted from one another among sensor devices is conceivable. Hence, it is important that delays for measurement timings can be set.

Figure 11:
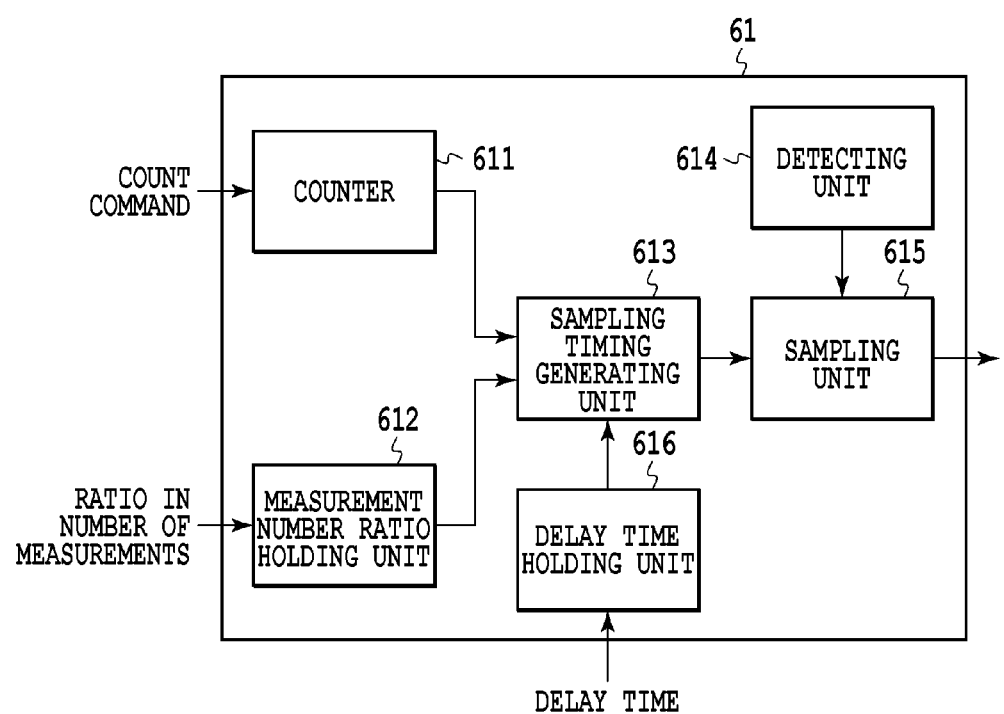
FIG. 11 is a configuration diagram for explaining Embodiment 2 of a sensor device with sampling functionality in the present invention.

FIG. 11 is a configuration diagram for explaining Embodiment 2 in the present invention of a sensor device with sampling functionality. FIG. 11 is a configuration diagram of a sensor device which allows setting and holding delay time of measurement start timing for each of detecting-units. A sensor device 61 in FIG. 11 includes: a counter 611; a ratio-of-measurement-interval-holding-unit 612; sampling-timing-generating-unit 613; a detecting-unit 614, a sampling-unit 615; and a delay-time-holding-unit 616.

The sensor device 61 in Embodiment 2 of the present invention includes: the counter 611 for counting the number of count commands which are used to perform measurements while maintaining a ratio of measurement intervals among multiple sensor devices; a ratio-of-measurement-interval-holding-unit 612 for setting the ratio of measurement intervals to a desired ratio of measurement intervals and holding respective values of the ratio of measurement intervals for each of the multiple sensor devices. The sensor device 61 also includes: the sampling-timing-generating-unit 613 for receiving a count value of the counter 611 and the setting value of the ratio of measurement interval which is held by the ratio-of-measurement-interval-holding-unit 612, and for generating a sampling timing signal after the delay time held by the delay-time-holding-unit 616 elapses from a time point of matching of the count value and the setting value; and the sampling-unit 615 for sampling detected signal detected by the detecting-unit 614, by using the sampling timing signal generated by the sampling-timing-generating-unit 613.

Specifically, the delay-time-holding-unit 616 for holding a desired measurement start delay time is connected to the sampling-timing-generating-unit 613 to delay the start of the sampling of the sampling-unit 615 by the sampling timing signal. Measurement data from the sensor device 61 is sent to a CPU (not illustrated) and is subjected to signal processing.

In this configuration, the delay-time-holding-unit 616 holding the desired delay time and the sampling-timing-generating-unit 613 generates the timing of the sampling start after the elapse of the delay time, on the basis of the count value and the held ratio of measurement interval.

Figure 12:
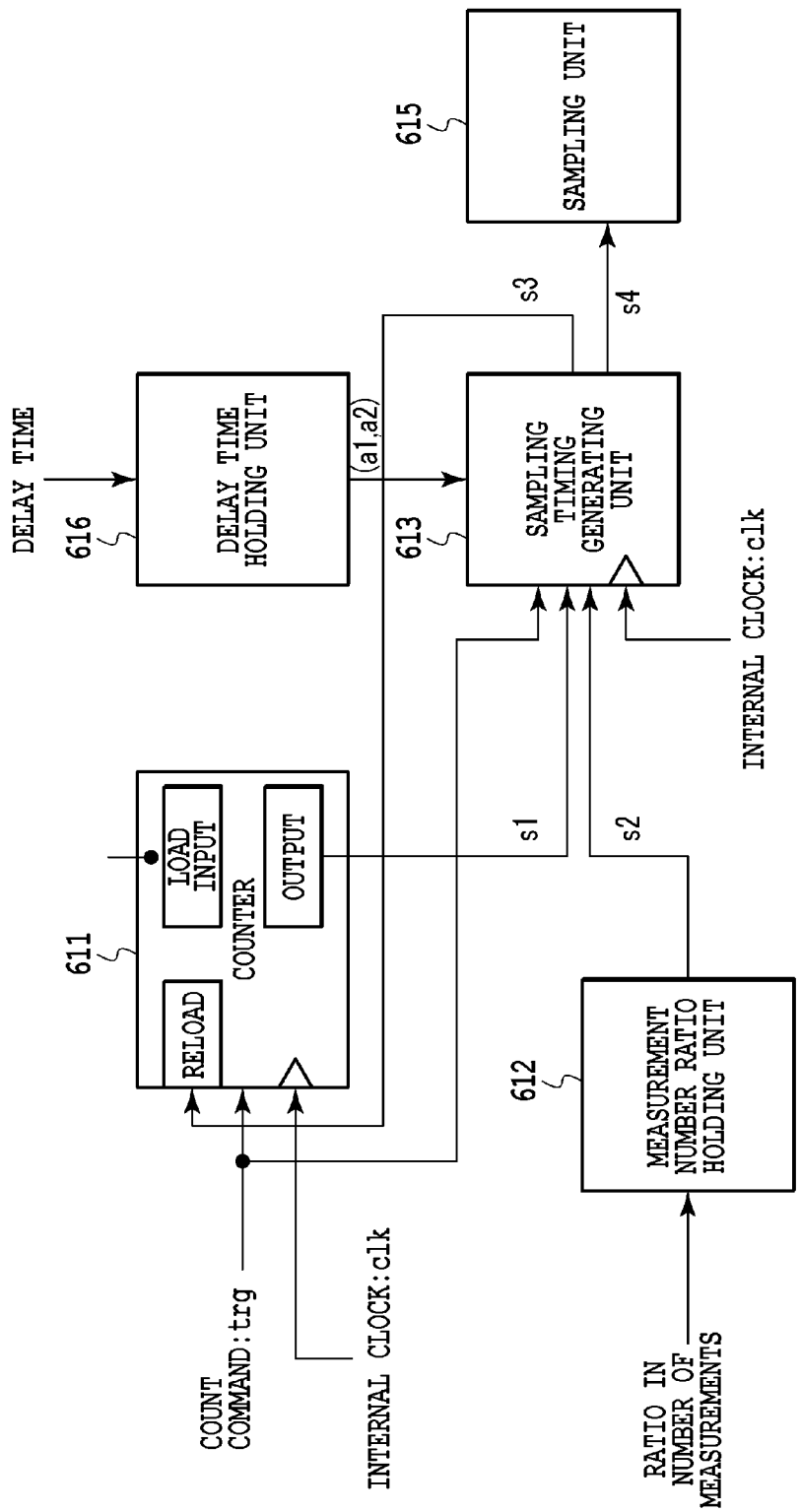
FIG. 12 is a view for explaining flows of signals of respective units in the configuration diagram shown in FIG. 11.
Figure 13:
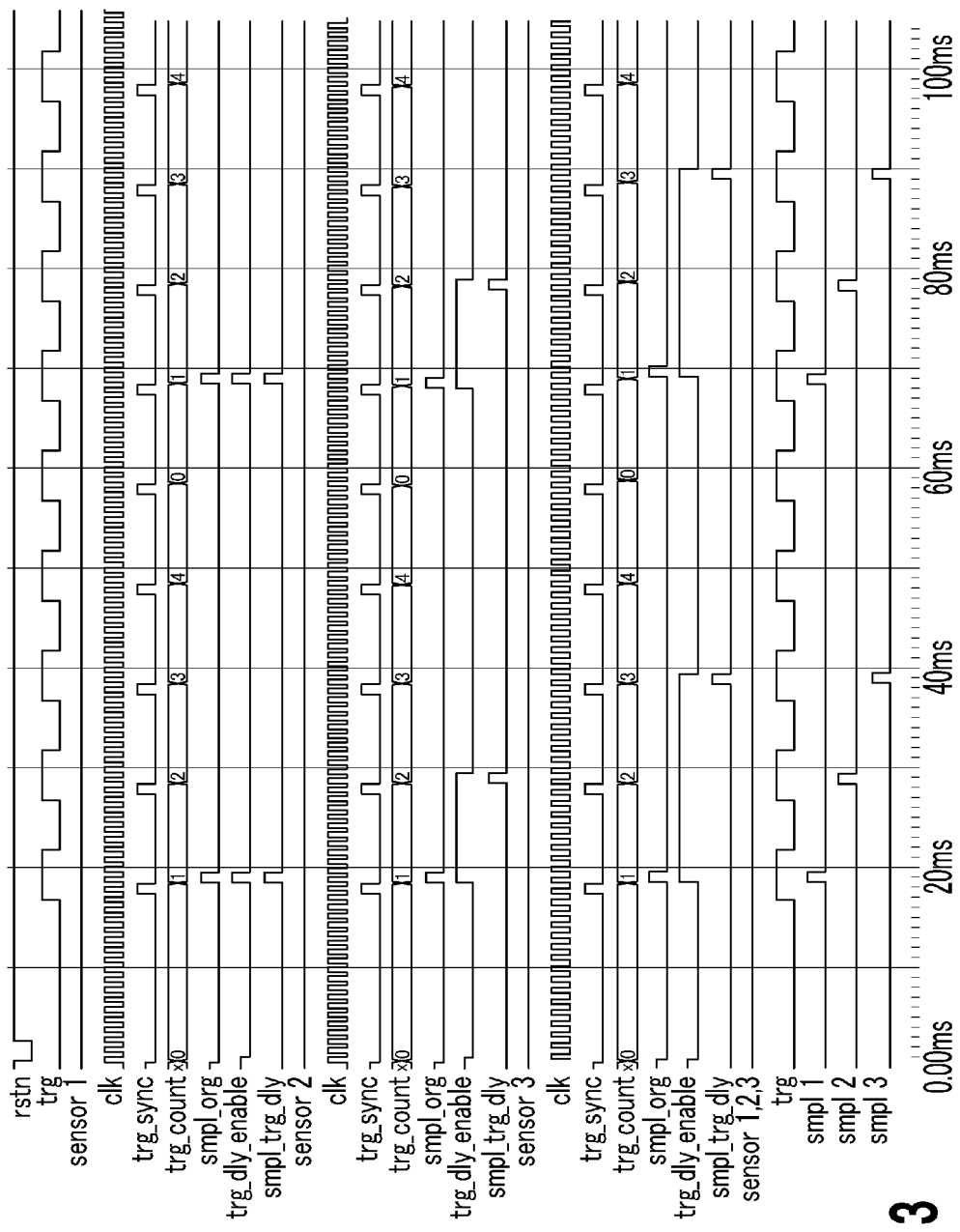
FIG. 13 is a view showing the signals of the respective units in FIG. 12.

FIG. 12 is a view for explaining flows of signals of the respective units in the configuration diagram shown in FIG. 11. FIG. 13 is a view showing the signals of the respective units in FIG. 12. FIG. 13 shows an example of a case where there are multiple sensor devices (sensor1, sensor2, and sensor3). In FIG. 13, two signals (rstn and trg) shown in the top rows are signals commonly inputted from the outside to all of the sensor devices. Next, six signals (clk to smpl_trg_dly) shown under each of the partition lines denoted sensor1, sensor2, and sensor3 are internal signals independently held by each of the sensor devices. Lastly, four signals (trg, smpl1, smpl2, and smpl3) shown under the partition line denoted sensor1, 2, 3 are the above-shown signals shown again to facilitate visualization of a state of synchronization among the multiple sensor devices, and trg is the same as trg in the top row while smpl1 to smpl3 are the same as smpl_trg_dly of the sensor devices sensor1 to sensor3, respectively.

Each of the sensor devices operates by using an independent internal clock (clk) of 1 KHz having an accuracy of plus or minus 10%. Moreover, the sensor device 1 holds value of 5, the sensor device 2 holds value of 5, and the sensor device 3 holds value of 5 as the ratio of measurement interval (s2). Delay time information (a1 and a2) is information for determining the final sampling timing and is specified as delay times from an internal basic sampling signal (smpl_org). Here, a delay time (a1) is a value indicating the number of count commands by which the sampling is delayed from the internal basic sampling signal. Meanwhile, a delay time (a2) is a value indicating the number of clocks by which the sampling is further delayed after the delay of a1 count commands. In this example, the sensor device 1 holds value of 0, the sensor device 2 holds value of 1, and the sensor device 3 holds value of 2 as the delay time a1 (in 0, the sensor device operates without a delay). Moreover, the sensor device 1 holds value of 0, the sensor device 2 holds value of 0, and the sensor device 3 holds value of 0 as the delay time a2. Furthermore, a common count command (trg) of 100 Hz is inputted to the respective sensor devices. In this example, the count command is a signal of one bit.

Each of the sensor devices fetches the count command by using its internal clock and generates an internal count command (trg_sync) which becomes active for one clock period. Furthermore, a value of the count command counter (trg_count and s1) is incremented by one every time the internal count command becomes active. When the value of the count command counter matches the value of the ratio of measurement interval (s2) minus 1, the value of the count command counter is reset to 0 by a count command counter reset signal (s3). When the internal count command becomes active with the count command counter being reset, an internal basic sampling signal (smpl_org) becomes active for one clock period. A sampling signal (smpl_trg_dly and s4), which becomes active for one clock period after a2 times of clock ticks during the a1-th active period of internal count command from a timing at which the internal basic sampling signal becomes active, becomes the output from the sampling-timing-generating-unit 613.

Figure 14:
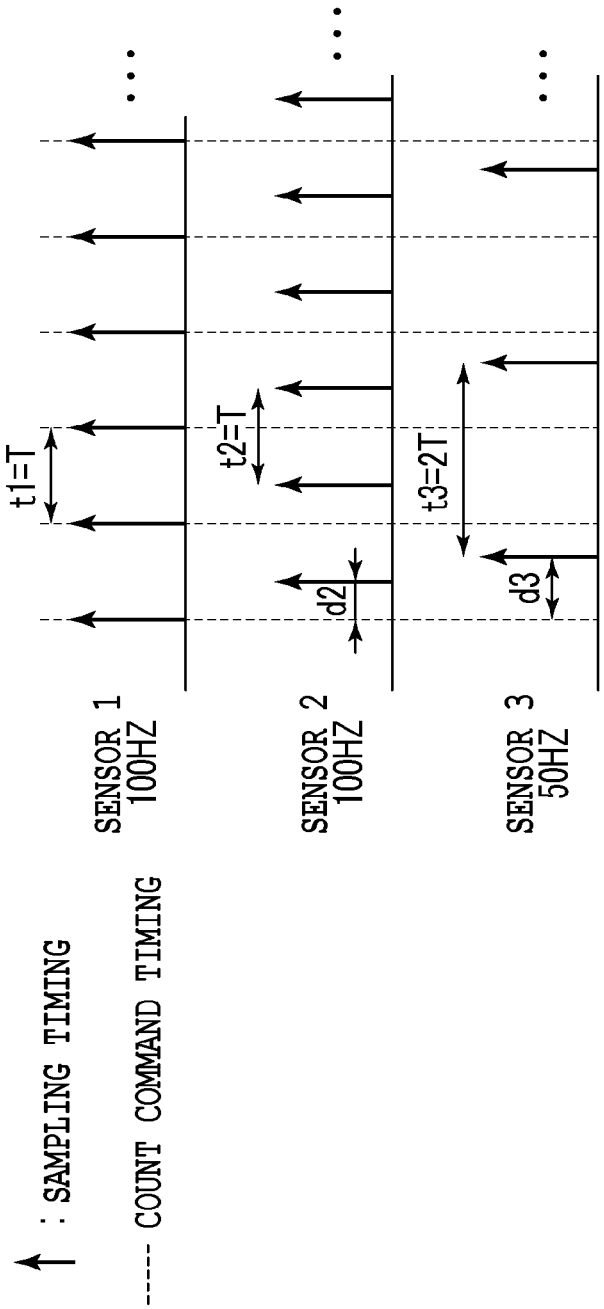
FIG. 14 is an explanatory view of a case where delay times for measurement start time of the multiple sensor devices can be set and held.

FIG. 14 is an explanatory view of a case where the delay times for the measurement start time of multiple sensor devices can be set and held. It is possible to arbitrarily set and hold the ratio of measurement interval among multiple sensor devices and also set and hold the delay times for the measurement start time of the sensor devices. This is useful in a case where the sampling times are desired to be slightly shifted from one another to avoid interference among the sensors. Moreover, the measurements can be autonomously performed with holding the set ratio of measurement interval in the respective sensor devices.

Embodiment 3

Figure 15:
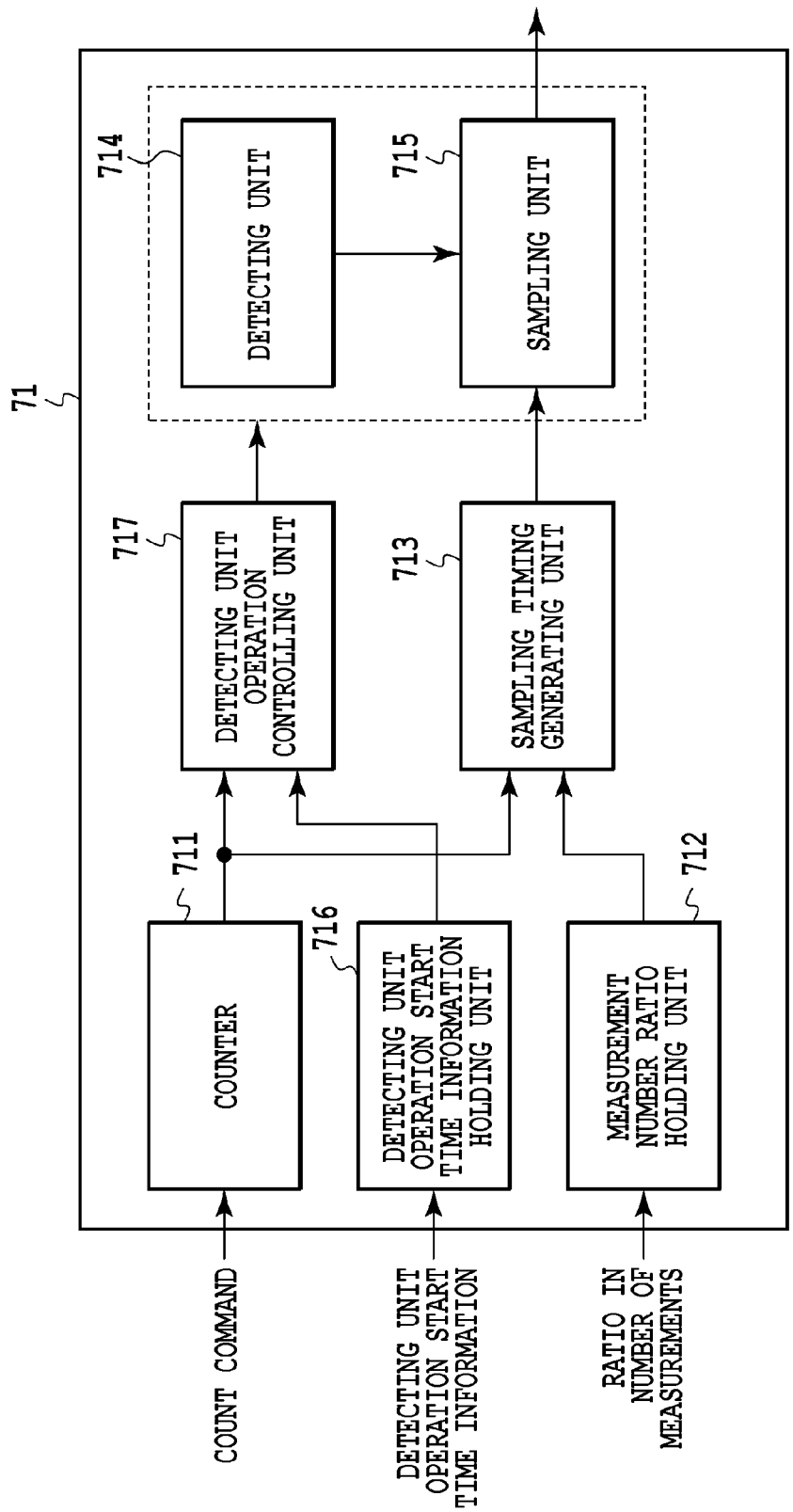
FIG. 15 is a configuration diagram for explaining Embodiment 3 of a sensor device with sampling functionality in the present invention.

FIG. 15 is a configuration diagram for explaining a sensor device with sampling functionality of Embodiment 3 in the present invention. FIG. 15 is a configuration diagram in which a detecting-unit-operation-start-time-holding-unit and a detecting-unit-operation-controlling-unit are included in Embodiment 1 shown in FIG. 6. A sensor device 71 in FIG. 15 includes: a counter 711; a ratio-of-measurement-interval-holding-unit 712; a sampling-timing-generating-unit 713; a detecting-unit 714; a sampling-unit 715; a detecting-unit-operation-start-time-holding-unit 716; and a detecting-unit-operation-controlling-unit 717.

The sensor device 71 in Embodiment 3 of the present invention includes: the counter 711 for counting the number of count commands used to perform measurements with holding a ratio of measurement interval in multiple sensor devices; the ratio-of-measurement-interval-holding-unit 712 for setting the ratio of measurement interval to a desired ratio of measurement interval and hold a setting value of the ratio of measurement interval in such a way that the multiple sensor devices each correspond to the setting value; and the detecting-unit-operation-start-time-holding-unit 716 for holding desired operation start time information of the detecting-unit. The sensor device 71 also includes: the detecting-unit-operation-controlling-unit 717 for controlling an operation of the detecting-unit 714 on the basis of a count value from the counter 711 and operation start time information of the detecting-unit from the detecting-unit-operation-start-time-holding-unit 716; the sampling-timing-generating-unit 713 for receiving the count value of the counter 711 and the setting value of the ratio of measurement interval which is held by the ratio-of-measurement-interval-holding-unit 712 and to generate a sampling timing signal after matching of the count value and the setting value; and the sampling-unit 715 for sampling a detection signal detected by the detecting-unit 714, by using the sampling timing signal generated by the sampling-timing-generating-unit 713. Measurement data from the sensor device 71 is sent to a CPU (not illustrated) and is subjected to signal processing.

Figure 16:
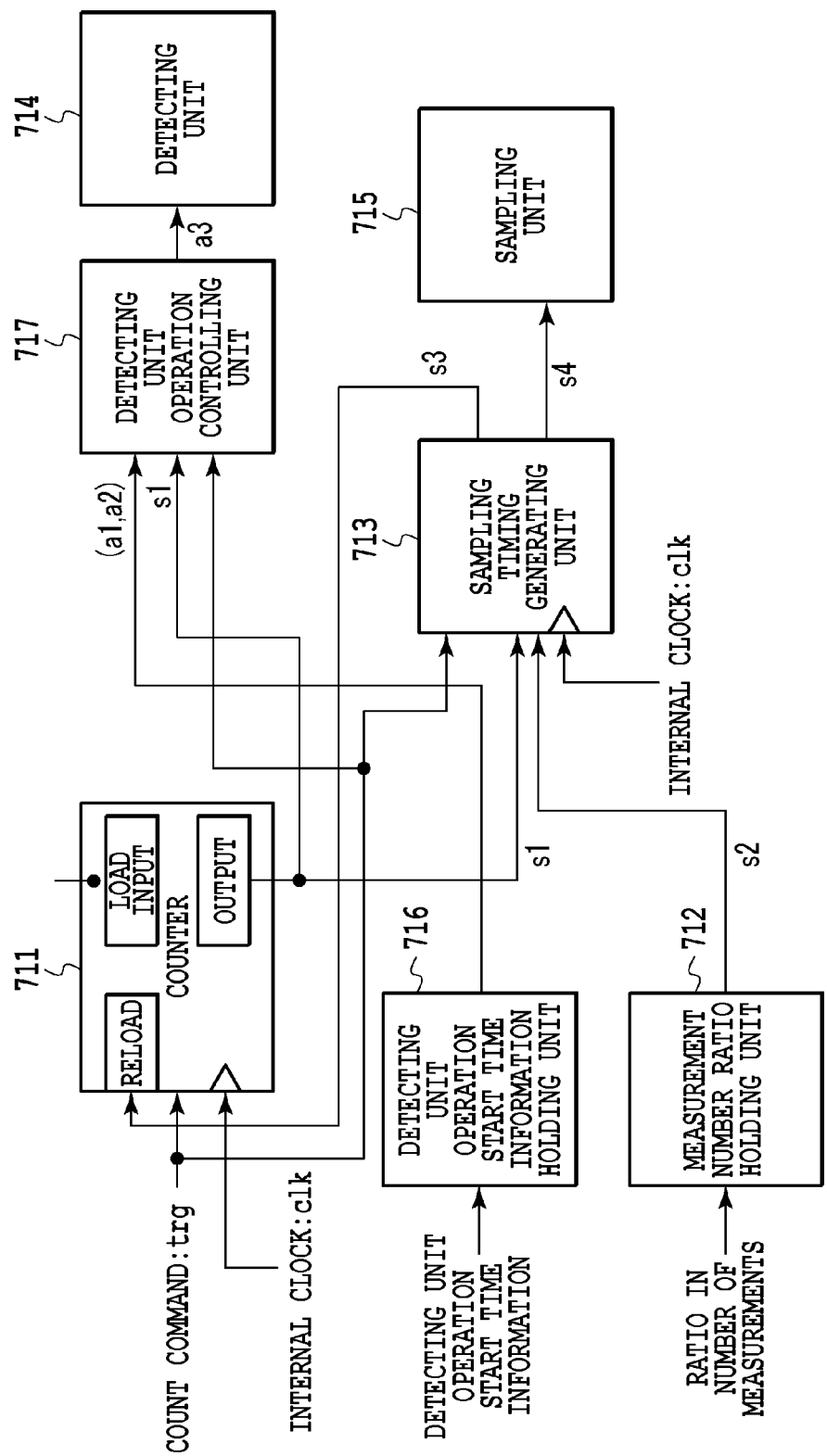
FIG. 16 is a view for explaining flows of signals of respective units in the configuration diagram shown in FIG. 15.
Figure 17:
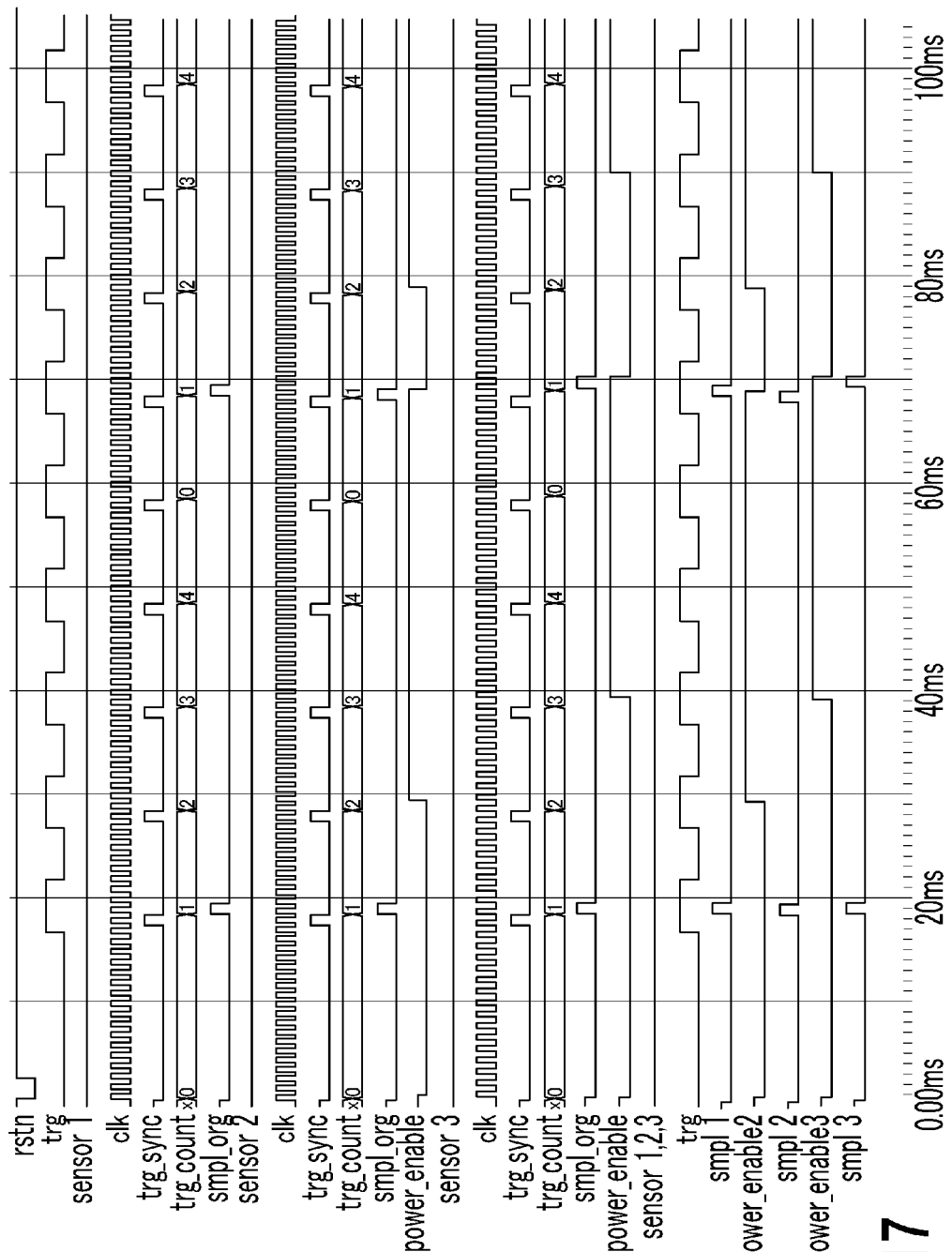
FIG. 17 is a view showing the signals of the respective units in FIG. 16.

FIG. 16 is a view for explaining flows of signals of the respective units in the configuration diagram shown in FIG. 15. FIG. 17 is a view showing the signals of the respective units in FIG. 16. FIG. 17 shows an example of a case where there are multiple sensor devices (sensor1, sensor2, and sensor3). In FIG. 17, two signals (rstn and trg) shown in the top row are signals commonly inputted from the outside to all of the sensor devices. Next, four signals (clk to smpl_org) or five signals (clk to power_enable) shown under each of the partition lines denoted sensor1, sensor2, and sensor3 are internal signals independently held by each of the sensor devices. Lastly, six signals (trg to smpl3) shown under the partition line denoted sensor1, 2, 3 are the above-shown signals shown again to facilitate visualization of a state of synchronization among the multiple sensor devices and an operation of the detecting-unit of each sensor device. Here, trg is the same as trg in the top row, smpl1 to smpl3 are the same as smpl_org of the sensor devices sensor1 to sensor3, and power_enable2 and power_enable3 are the same as power_enable of the sensor devices sensor2 and sensor3.

Each of the sensor devices operates by using an independent internal clock (clk) of 1 KHz having an accuracy of plus or minus 10%. Moreover, the sensor device1 holds values 5, the sensor device 2 holds values of 5, and the sensor device 3 holds values of 5 as the ratio of measurement interval (s2). The detecting-unit operation start time information (a1 and a2) is information for determining a operation start time of the determination-unit and is specified as delay times from the internal basic sampling signal (smpl_org and s4). Here, a delay time (a1) is a value indicating the number of count commands by which the operation start is delayed from the internal basic sampling signal. Meanwhile, a delay time (a2) is a value indicating the number of clocks by which the operation start is further delayed after the delay of a1 count commands. In this example, the sensor device 1 hold value of 0, the sensor device 2 holds value of 1, and the sensor device 3 hold value of 2 as the delay time a1. Moreover, the sensor device 1 hold value of 0, the sensor device 2 holds value of 0, and the sensor device 3 holds value of 0 as the delay time a2. Furthermore, a common count command (trg) of 100 Hz is inputted to the respective sensor devices. In this example, the count command is a signal of one bit.

Each of the sensor devices fetches the count command by using its internal clock and generates an internal count command (trg_sync) which becomes active for one clock cycle. Furthermore, a value of the count command counter (trg_count and s1) is incremented by one every time the internal count command becomes active. When the value of the count command counter matches −1 of the value of the ratio of measurement interval (s2), the value of the count command counter is reset to 0 by a count command counter reset signal (s3). When the internal count command becomes active with the count command counter being reset, an internal basic sampling signal (smpl_org) becomes active for one clock cycle. This signal becomes a sampling signal (s4) which is an output of the sampling-timing-generating-unit 713.

The detecting-unit-operation-controlling-unit 717 detects a timing of a2 times of clock operation from the timing at which the a1-th internal count command from the activation timing of the sampling signal becomes active, and the operation of the detecting-unit 714 is started at this timing. Thereafter, the detecting-unit 714 is paused at the completion of the next sampling (for example, at a falling edge of the sampling signal) and is made to wait until start timing of the next operation.

Figure 18B:
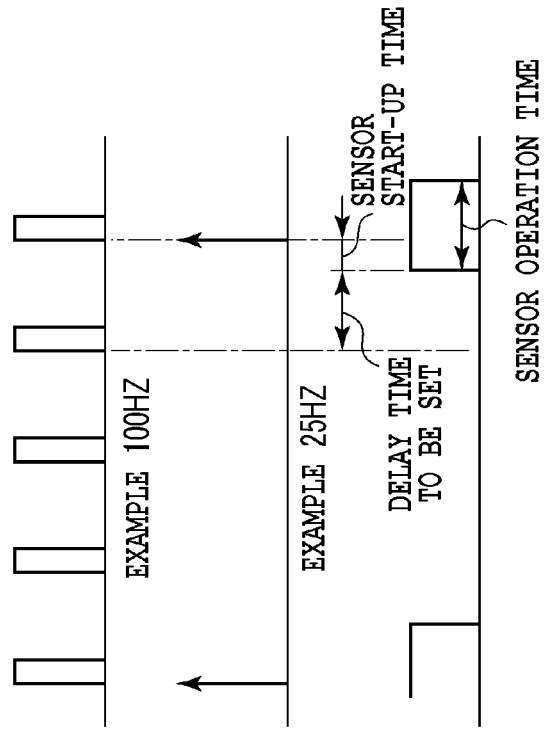
FIG. 18B is an explanatory view of a case where, in Embodiment 3 of the sensor device with sampling functionality in the present invention, the ratio of measurement interval in the respective sensor devices can be arbitrary set and be held and the operation start time and the end time of each detecting-unit can be also set and held as the delay time.
Figure 18A:
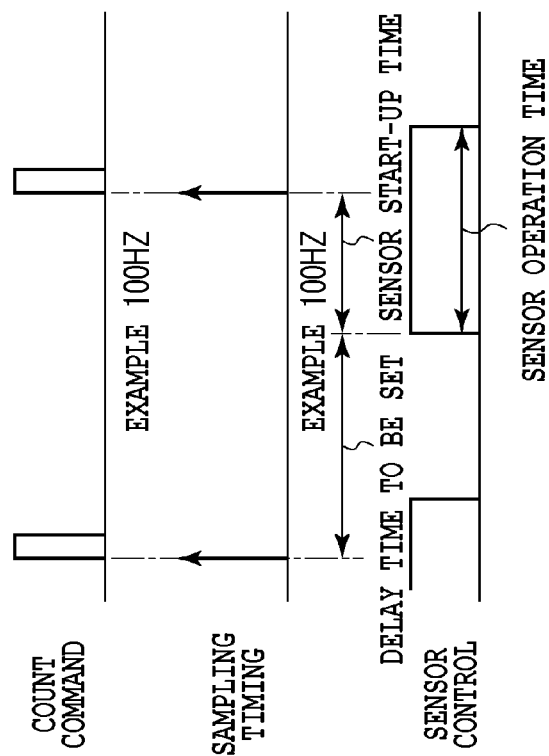
FIG. 18A is an explanatory view of a case where, in Embodiment 3 of the sensor device with sampling functionality in the present invention, the ratio of measurement interval in the sensor devices can be arbitrary set and be held and an operation start time and an end time of each detecting-unit can be also set and held as a delay time.

FIGS. 18A and 18B are explanatory views of a case where, in Embodiment 3 of the sensor device with sampling functionality in the present invention, the ratio of measurement interval among the sensor devices can be arbitrary set and be held and the operation start time and end time of each detecting-unit can be also set and held as the delay time. FIG. 18A shows a case where the ratio of measurement interval is 1 and FIG. 18B shows a case where the ratio of measurement interval is 4.

It is possible to start the operation of the detecting-unit earlier than the sampling timing by a set time and thereby start the sampling at the sampling timing without a delay.

Moreover, the detecting-unit can be set to a pause mode in times other than the sampling timing.

Embodiment 4

Figure 19:
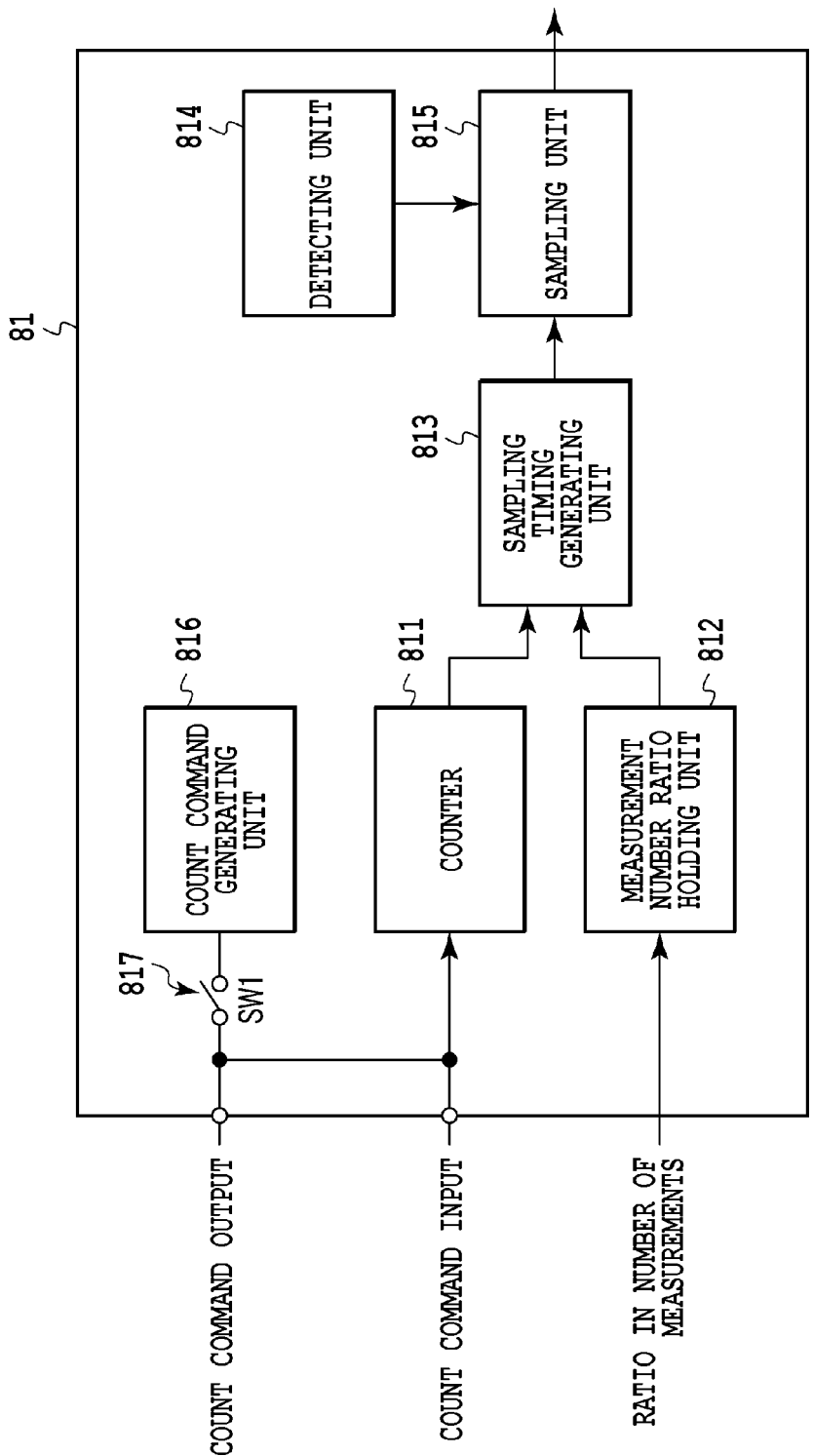
FIG. 19 is a configuration diagram for explaining Embodiment 4 of a sensor device with sampling functionality in the present invention.

FIG. 19 is a configuration diagram for explaining Embodiment 4 of a sensor device with sampling functionality in the present invention. FIG. 19 is a configuration diagram in which a count-command-generating-unit is added to the counter in Embodiment 1 shown in FIG. 6. A sensor device 81 includes: a counter 811; a ratio-of-measurement-interval-holding-unit 812; a sampling-timing-generating-unit 813; a detecting-unit 814; a sampling-unit 815; the count-command-generating-unit 816; and a count command output controlling-unit 817 (SW1).

The sensor device 81 in Embodiment 4 of the present invention includes: the counter 811 for counting the number of count commands which are used to perform measurements while maintaining a ratio of measurement interval among multiple sensor devices; the count-command-generating-unit 816 for generating a count command; and the count command output controlling-unit 817 for determining whether to use the generated count command as a count command for synchronization among the sensor devices. The sensor device 81 also includes: the ratio-of-measurement-interval-holding-unit 812 for setting the ratio of measurement interval to a desired ratio of measurement intervals and holding a respective value of the ratio of measurement intervals for each of multiple sensor devices; the sampling-timing-generating-unit 813 for receiving a count value of the counter 811 and the setting value of the ratio of measurement intervals which is held by the ratio-of-measurement-interval-holding-unit 812 and for generating a sampling timing signal based on the comparison result between count value and the setting value; and the sampling-unit 815 for sampling of detected signals detected by the detecting-unit 814, by using the sampling timing signal generated by the sampling-timing-generating-unit 813. Measurement data from the sensor device 81 is sent to a CPU (not illustrated) and is subjected to signal processing.

Specifically, the count-command-generating-unit 816 for generating the count command is provided and, in a case where the count command generated by the count-command-generating-unit 816 is used, the sensor device 81 can output the count command to the outside while inputting the count command to the counter 811. The count command output controlling-unit (SW1) 817 is provided between a count command output terminal and the count-command-generating-unit 816, and a line between a count command input terminal and the counter 811 and a line between the count command output terminal and the count-command-generating-unit 816 are connected to each other.

This configuration makes it possible to arbitrarily set and to hold the ratio of measurement interval the respective sensor devices as in sensor data processing systems shown in FIGS. 25 to 31 to be described later. This configuration makes it possible to autonomously perform measurements while holding the set ratio of measurement interval in the respective sensor devices. Moreover, the sensor device performs an output control of the count command in which the sensor device can supply the count command generated therein to the outside while operating according to the same count command. Hence, the sensor device can serve as a master for synchronizing the sensor devices, by outputting the generated count command to the other sensors. The multiple sensor devices in FIGS. 25 to 31 include sensor devices 101, 102, and 103.

Figure 20:
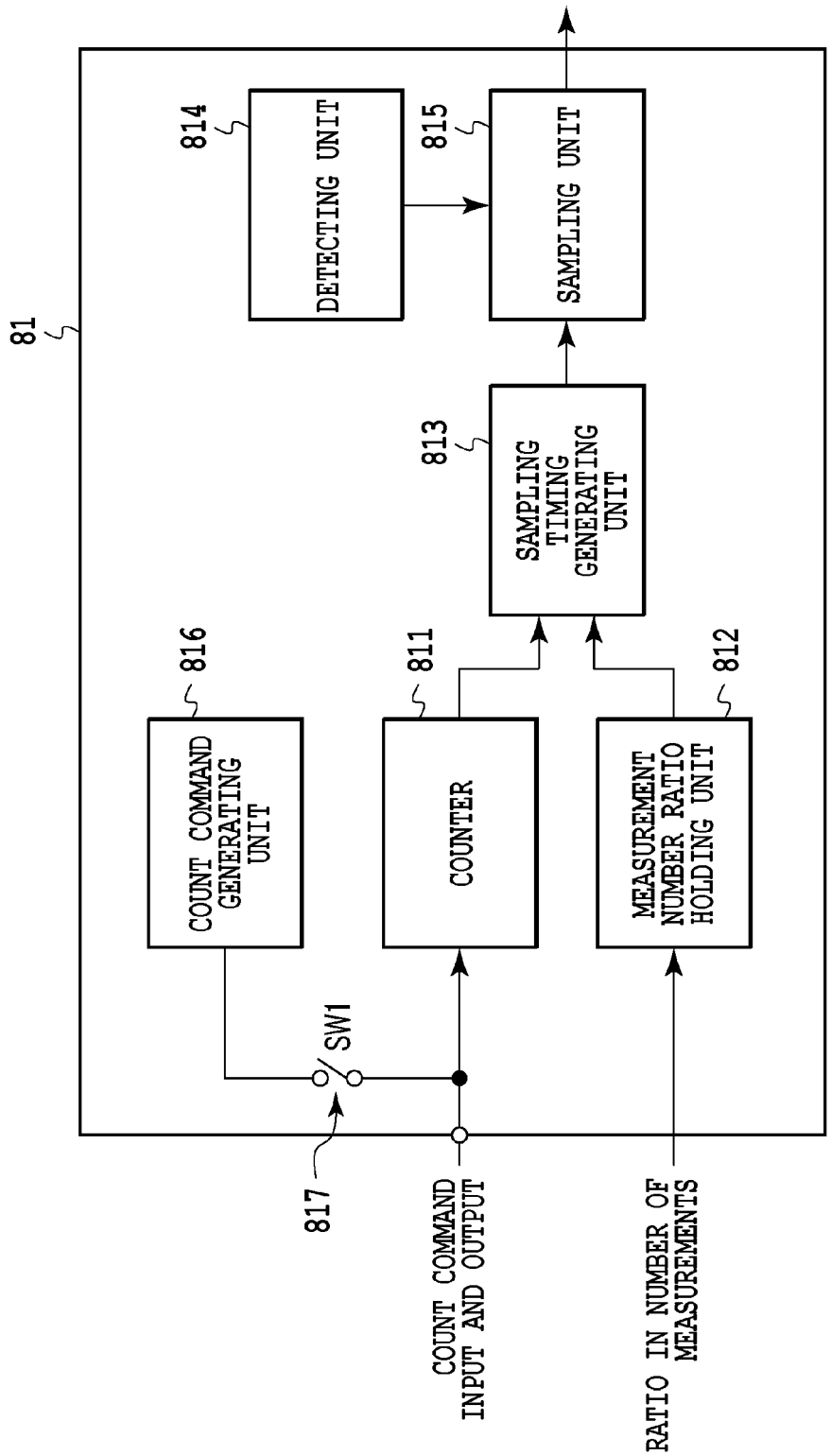
FIG. 20 is a configuration diagram for explaining a modified example of Embodiment 4 of the sensor device with sampling functionality in the present invention.

FIG. 20 is a configuration diagram for explaining a modified example of Embodiment 4 of the sensor device with sampling functionality in the present invention. FIG. 20 is a configuration diagram in which the count-command-generating-unit is added to the counter of Embodiment 1 shown in FIG. 6. In FIG. 19, the sensor device includes the count command input terminal and the count command output terminal. However, in FIG. 20, the sensor device includes only a count command input-output terminal and the count command output controlling-unit (SW1) 817 is provided between the count command input-output terminal and the count-command-generating-unit 816. In other words, FIG. 20 is a configuration diagram in which interfaces respectively for the counter command output and the count command input which are shown in FIG. 19 are integrated into a common interface.

The sensor device in the modified example of Embodiment 4 of the present invention can implement two operations to perform measurement while holding the ratio of measurement interval in the multiple sensor devices. First, in a case where the sensor device operates as the master for synchronizing the sensor devices (SW1 is set to ON), the sensor device can output the count command generated by count command generating means therein to the outside while inputting the count command to the counter. In this case, the direction of a count command input-output interface is output of the command. Next, in a case where the sensor device operates in synchronization with the other sensor devices according to a master outside the sensor device (SW1 is set to OFF), the sensor device inputs, to the counter, the count command received from the outside via the count command input-output interface. In this case, the direction of the count command input-output interface is input of the command.

In other words, an interface for outputting the count command generated by the count-command-generating-unit 816 to the outside and an interface for receiving the count command from the outside are a single interface.

In this configuration, the sensor device requires no separate interfaces for input and output and it is possible to implement in a simpler configuration than the same functions as those of the configuration shown in FIG. 19. Thus, there is obtained an effect that not only the configuration of each sensor device is made simpler, but also the configuration of the entire sensor data processing system is made simpler.

Figure 21:
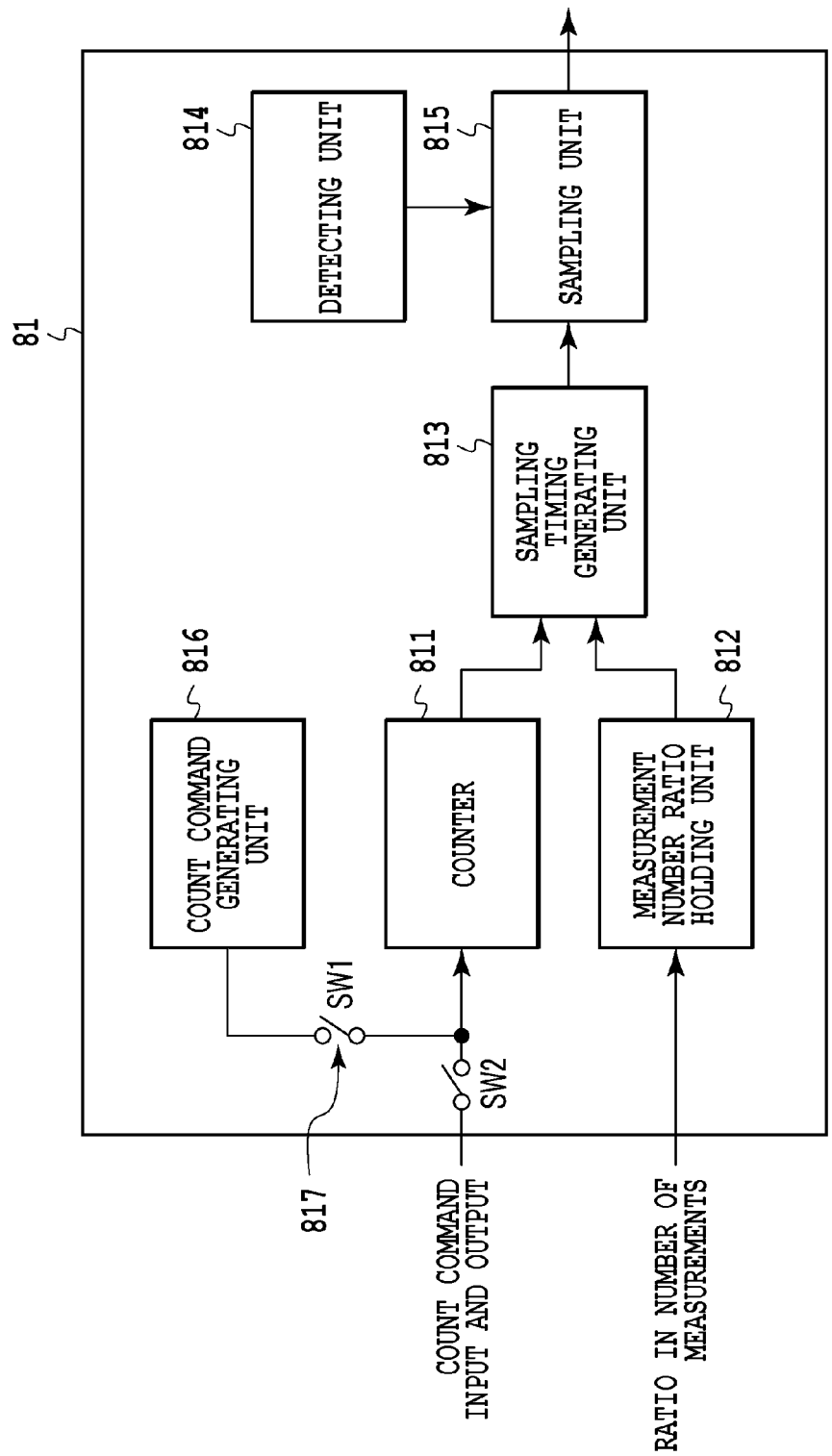
FIG. 21 is a configuration diagram for explaining another modified example of Embodiment 4 of the sensor device with sampling functionality in the present invention.

FIG. 21 is a configuration diagram for explaining another modified example of Embodiment 4 of the sensor device with sampling functionality in the present invention. FIG. 21 is a configuration diagram in which the count-command-generating-unit is added to the counter of Embodiment 1 shown in FIG. 6. As in FIG. 20, the sensor device includes only the count command input-output terminal. However, SW2 is provided between the count command input-output terminal and the counter. In other words, FIG. 21 is a configuration diagram in which the counter command input-output interface of the modified example shown in FIG. 20 can be disconnected from the count-command-generating-unit 816 and the counter 811 in the sensor device.

The sensor device in the other modified example of Embodiment 4 can implement three operations to perform measurement while holding the ratio of measurement interval in the multiple sensor devices. First, in a case where the sensor device operates as the master for synchronizing the sensor devices (SW1 and SW2 are both set to ON), the sensor device can output the count command generated by count-command-generating-unit 816 therein to the outside while inputting the count command to the counter. In this case, the direction of the count command input-output interface is the output of the command. Next, in a case where the sensor device operates in synchronization with the other sensor devices according to the master outside the sensor device (SW1 is set to OFF, SW2 is set to ON), the sensor device inputs, to the counter 811, the count command received from the outside via the count command input-output interface. In this case, the direction of the count command input-output interface is the input of the command. Moreover, in a case where the sensor device operates independently without being synchronized with the other sensor devices (SW1 is ON, SW2 is OFF), the sensor device inputs the count command generated by the count-command-generating-unit 816 therein to the counter 811. However the sensor device does not output this command to the outside. In this case, the count command input-output interface is disconnected from the count-command-generating-unit 816 and the counter 811 in the sensor device.

This configuration makes it possible to achieve multiple master-slave configurations by switching the operation modes of the respective sensor devices, even in a state where physical connections among the multiple sensor devices are fixed.

In other words, the sensor device is switchable between an operation mode in which the count command generated by the count-command-generating-unit 816 is inputted to the counter 811 and an operation mode in which the count command received from the outside is inputted to the counter 811.

Figure 26:
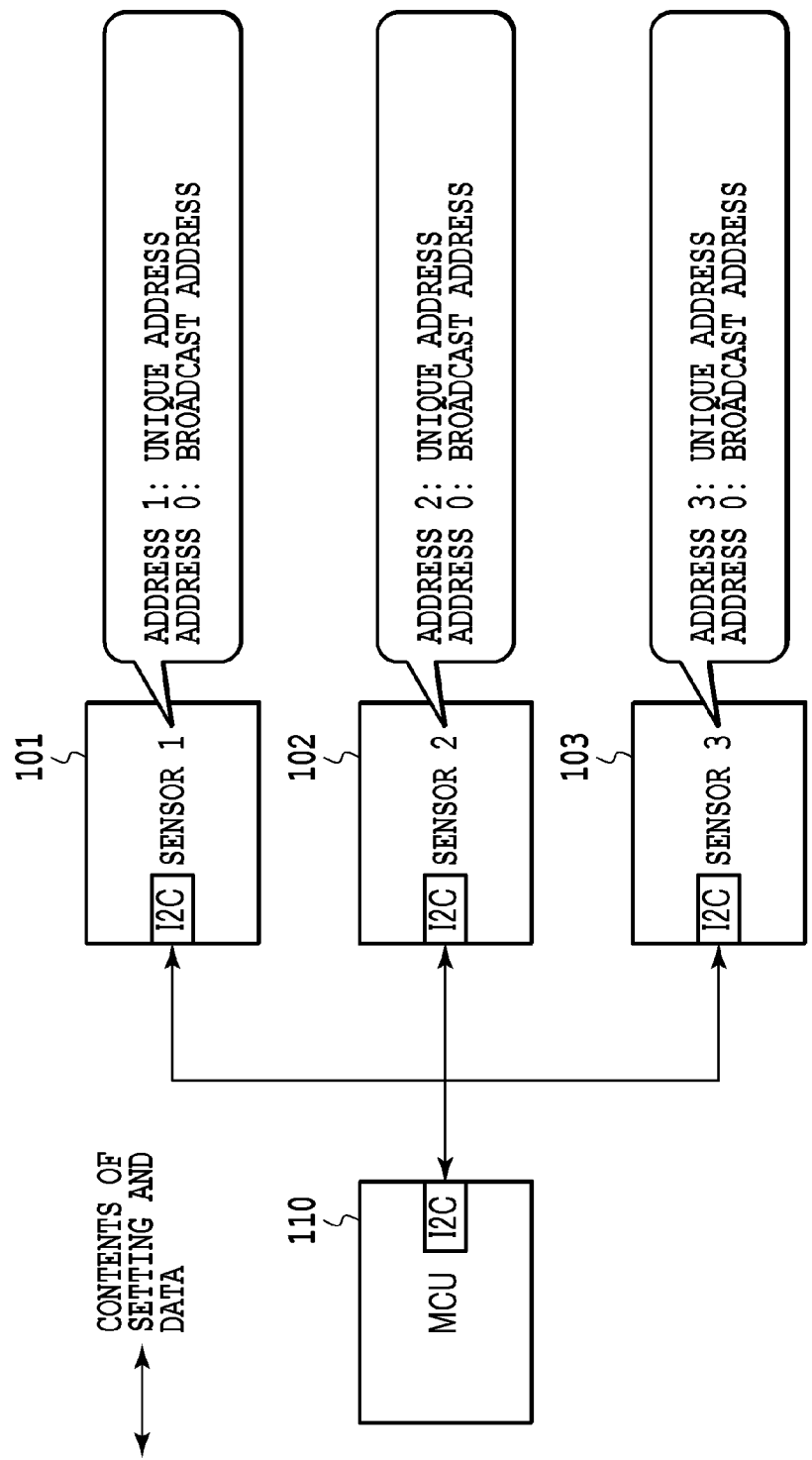
FIG. 26 is a system configuration diagram which explains operations in the block diagram shown in FIG. 25.

Moreover, the interface for outputting the count command generated by the count-command-generating-unit 816 to the outside and the interface for receiving the count command from the outside may be the single interface, and the single interface may be an I2C bus. "I2C" is a serial bus used in embedded systems, mobile phones, and the like and stands for Inter-Integrated Circuit, generally written I2C and called "I-two-C". A data processing system using the I2C bus is shown in FIG. 26 to be described later.

Figure 27:
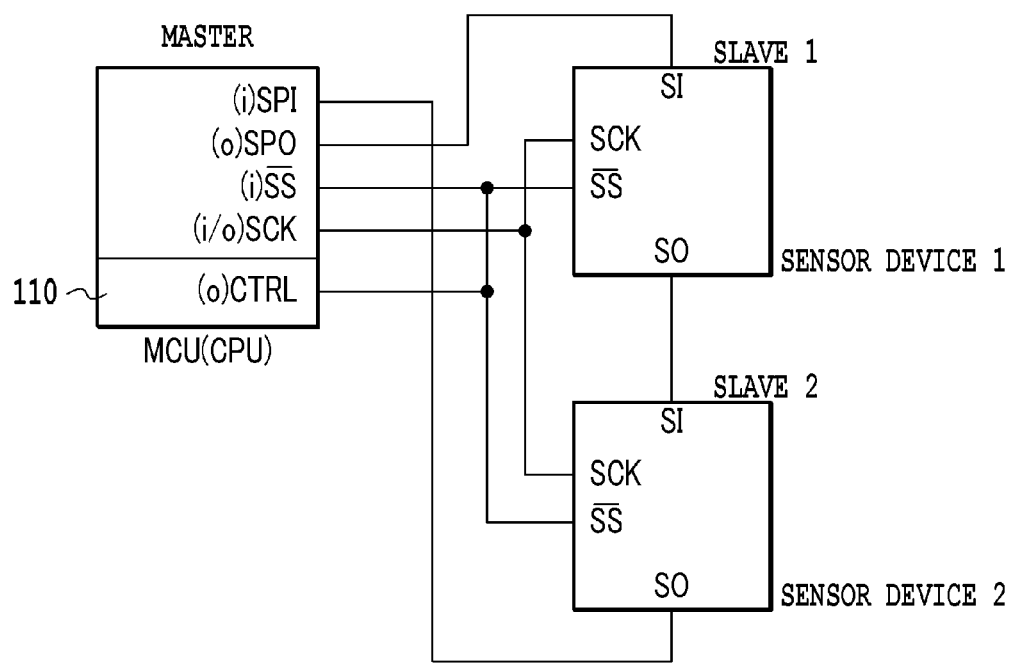
FIG. 27 is a system configuration diagram which explains operations in the block diagram shown in FIG. 25.

Alternatively, the interface for outputting the count command generated by the count-command-generating-unit 816 to the outside and the interface for receiving the count command from the outside may be the single interface, and the single interface may be an SPI bus. "SPI" stands for Serial Peripheral Interface and is a bus connecting devices used in a computer. The SPI bus is a type of serial bus which requires fewer connection terminals than a parallel bus and is used for devices performing data transfer at relatively low speeds. A data processing system using the SPIC bus is shown in FIG. 27 to be described later.

Figure 22:
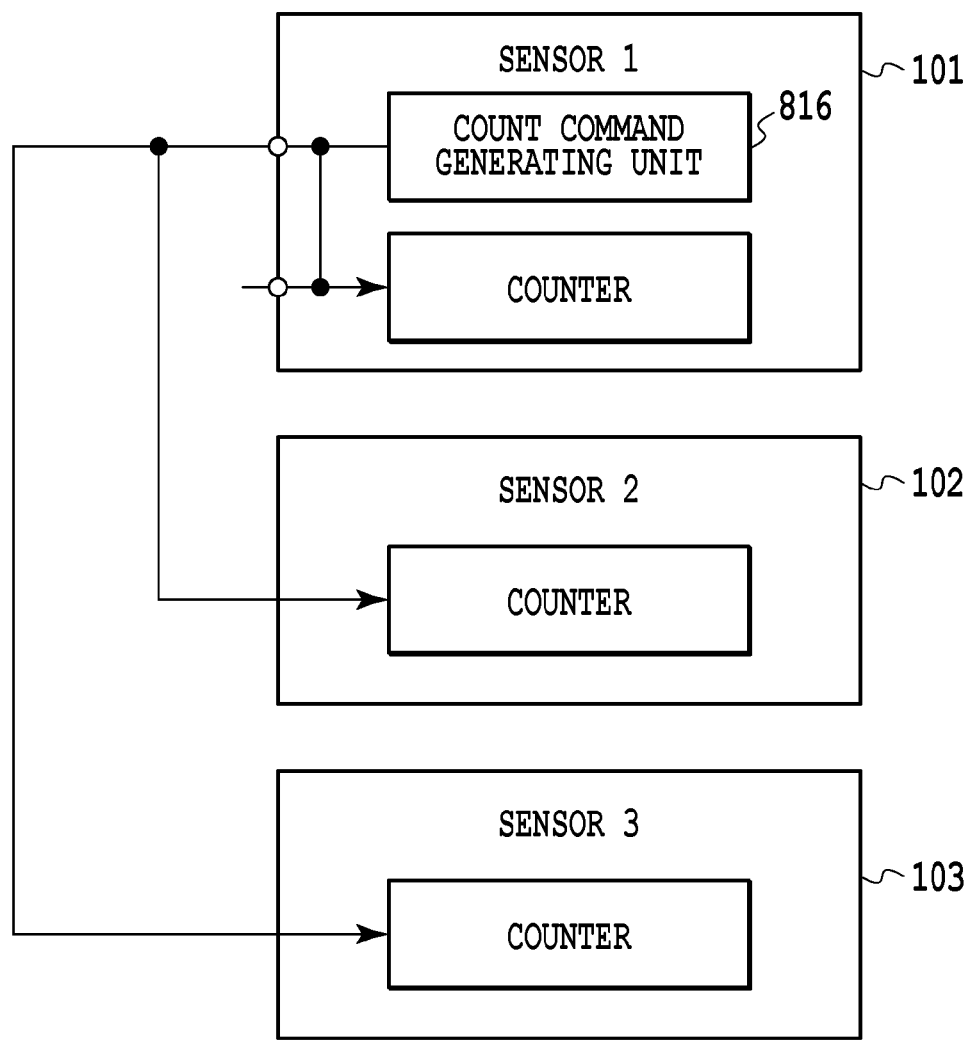
FIG. 22 is a block diagram of a sensor data processing system in which the ratio of measurement interval in the respective sensor devices shown in FIG. 19 can be arbitrarily set and be held and in which measurements can be autonomously performed with holding the set ratio of measurement interval in the respective sensor devices.

FIG. 22 is a block diagram of a sensor data processing system in which the ratio of measurement interval in the respective sensor devices shown in FIG. 19 can be arbitrarily set and be held and in which measurements can be autonomously performed with holding the set ratio of measurement interval in the sensor devices. FIG. 22 shows a relationship of the multiple sensor devices 101, 102, and 103 each including the count command input terminal and the count command output terminal.

Figure 23:
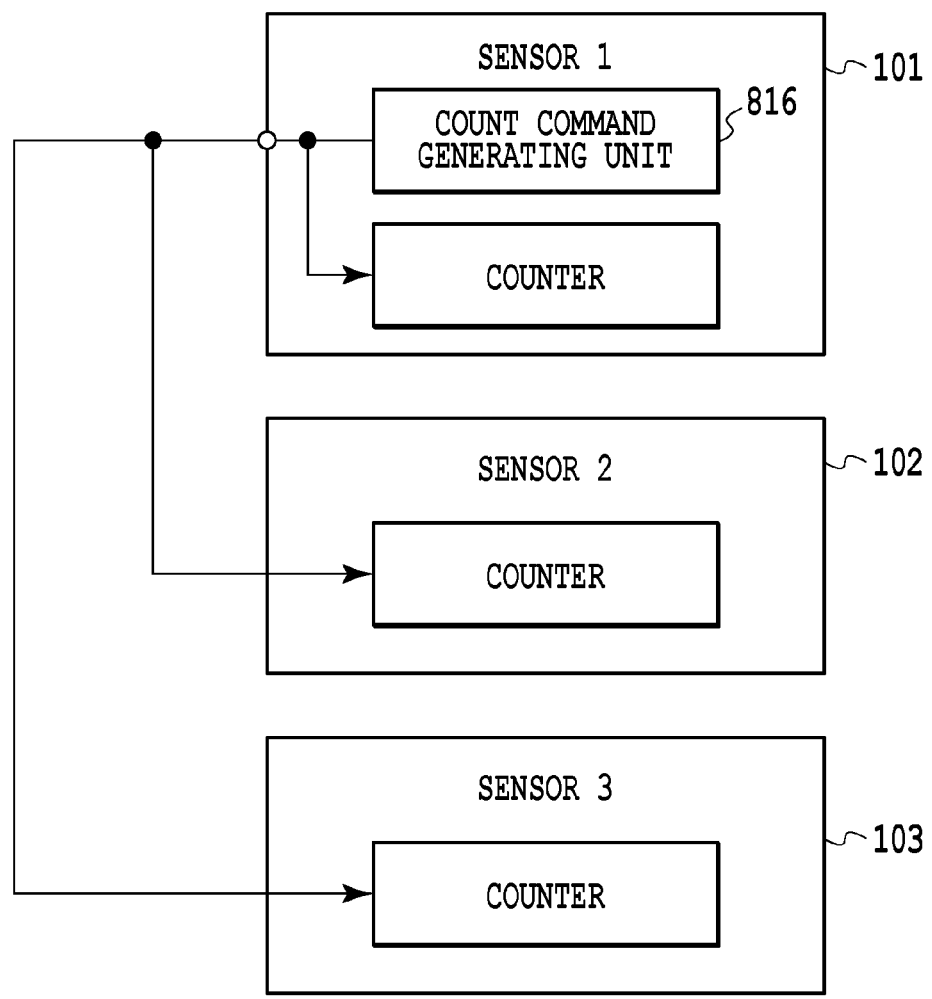
FIG. 23 is a block diagram of a sensor data processing system in which the ratio of measurement interval in the respective sensor devices shown in FIGS. 20 and 21 can be arbitrarily set and be held and in which measurements can be autonomously performed with holding the set ratio of measurement interval in the respective sensor devices.
Figure 24A:
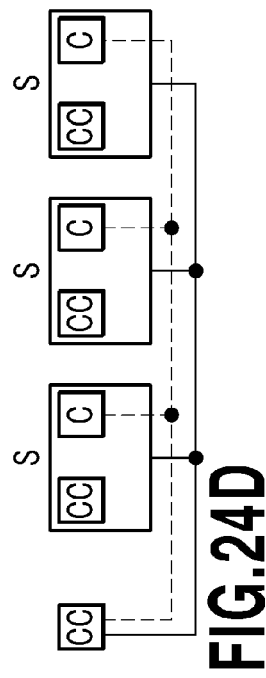
FIG. 24A is a system configuration diagram showing various connection relationships among the sensor devices each having the configuration shown in FIG. 21.
Figure 24B:
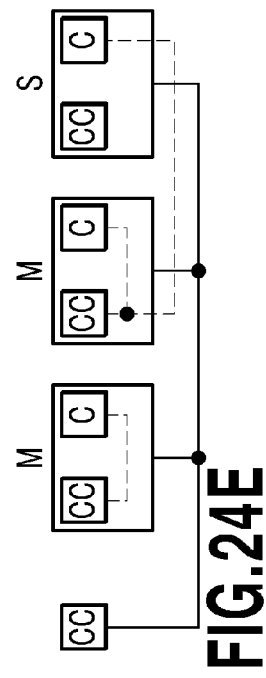
FIG. 24B is a system configuration diagram showing various connection relationships among the sensor devices each having the configuration shown in FIG. 21.
Figure 24C:
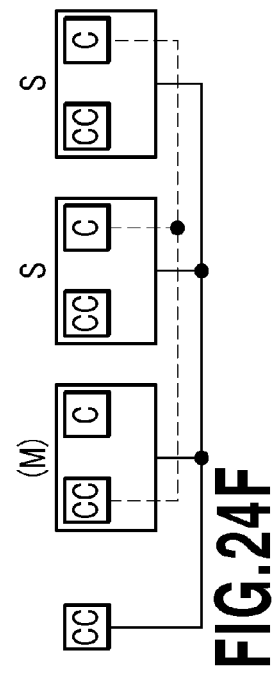
FIG. 24C is a system configuration diagram showing various connection relationships among the sensor devices each having the configuration shown in FIG. 21.
Figure 24D:
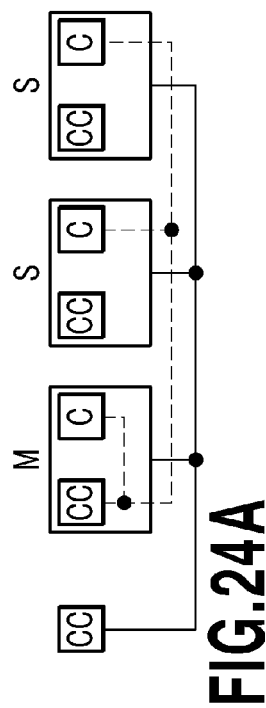
FIG. 24D is a system configuration diagram showing various connection relationships among the sensor devices each having the configuration shown in FIG. 21.
Figure 24E:
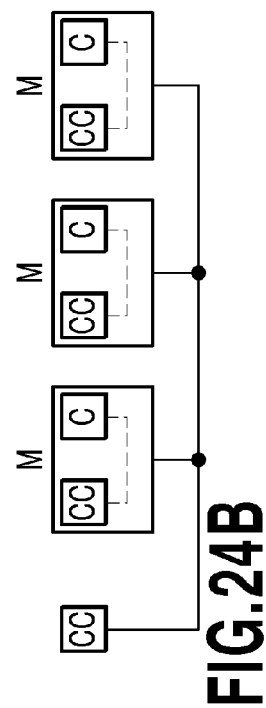
FIG. 24E is a system configuration diagram showing various connection relationships among the sensor devices each having the configuration shown in FIG. 21.
Figure 24F:
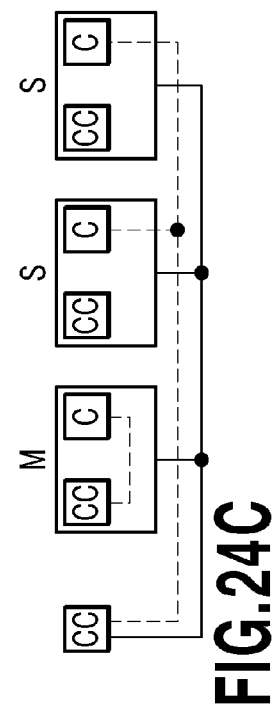
FIG. 24F is a system configuration diagram showing various connection relationships among the sensor devices each having the configuration shown in FIG. 21.

FIG. 23 is a block diagram of a sensor data processing system in which the ratio of measurement interval in the respective sensor devices shown in FIGS. 20 and 21 can be arbitrarily set and be held and in which measurements can be autonomously performed with holding the set ratio measurement interval in the respective sensor devices. FIG. 23 shows a relationship of the multiple sensor devices 101, 102, and 103 each including only the count command input-output terminal.

FIGS. 24A to 24F are system configuration diagrams showing various connection relationships among the sensor devices each having the configuration shown in FIG. 21. The system in FIG. 24A to 24F includes: the count-command-generating-unit CC; the counter C; the master M; and the slave S. Moreover, among the interconnections in the drawings, the interconnections illustrated by solid lines show physical connections among the sensor devices while the interconnections illustrated in broken lines each show a final connection between the count-command-generating-unit and the counter which is achieved by switching the operation mode of the sensor device. As is apparent from FIGS. 24A to 24F, multiple master-slave configurations can be achieved by switching the operations modes of the respective sensor devices even in a state where physical connections among the sensor devices are fixed.

As described above, it is possible to provide the sensor device with sampling functionality which allows the ratio of measurement interval in the multiple sensor devices to be arbitrary set and to be held and which can autonomously perform measurements while holding the set ratio of measurement interval in the respective sensor devices.

FIGS. 25 to 31 are block diagrams for explaining sensor data processing systems using the aforementioned multiple sensor devices of the present invention.

Embodiment 5

Figure 25:
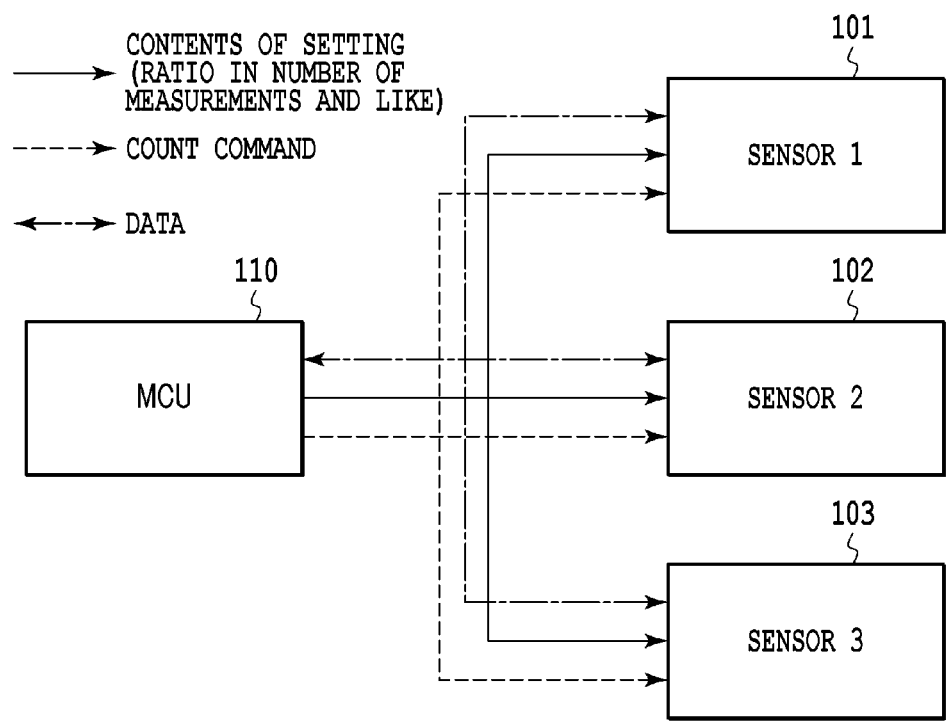
FIG. 25 is a block diagram for explaining a sensor data processing system using multiple sensor devices in Embodiment 5 of the present invention.

FIG. 25 is a block diagram for explaining a data processing system using sensor devices in Embodiment 5 of the present invention. The data processing system in FIG. 25 includes the sensor devices 101 to 103 and a MCU 110 (sensor-data-processing-unit). Note that the broken lines indicate a count command, the solid lines indicate other commands and contents of setting such as a ratio of measurement interval, and one-dot chain lines indicate data.

Here, the MCU (Micro Controller-Unit; Micro Controller) refers to an embedded microprocessor in which a computer system is integrated into one integrated circuit. The MCU is used mainly for control of electronic equipments and the like. Unlike common microprocessors, many peripheral functions including memory such as ROM and RAM, functions related to I/O, and similar functions are mounted in the MCU itself. Accordingly, the cost for constructing a system can be suppressed compared to the case where ROM and the like are mounted as independent parts. In the present invention, the MCU functions as the sensor-data-processing-unit.

Embodiment 5 includes sensor devices 101, 102, and 103 having the functions of the present invention and the MCU 110 connected to the sensor devices 101, 102 and 103. The MCU 110 has: a function of setting the ratio of measurement interval and the like and transmitting information on the setting to the sensor devices 101, 102, and 103; a function of generating a count command and transmitting the count command to the sensor devices 101, 102, and 103; and a function of receiving data from the sensor devices 101, 102, and 103.

FIG. 26 is a system configuration diagram which explains operations in the block diagram shown in FIG. 25 and which shows a case where an I2C bus is used as a single count command input-output interface.

The sensor devices 101, 102, and 103 and the MCU 110 has I2C interfaces and perform communication each other by I2C. The MCU 110 sets the ratio of measurement interval and transmits the set ratio to the sensor devices 101, 102, and 103. The sensor devices 101, 102, and 103 each have a broadcast address in addition to a unique address and simultaneously receive the count command transmitted from the MCU 110 by using the broadcast address. Each of the sensor devices 101, 102, and 103 autonomously performs a measurement at the set ratio of measurement interval according to the count command and sets an interrupt flag after completing the measurement. The MCU 110 fetches data upon detecting the interrupt flag of the measurement completion.

Embodiment 6

Figure 28:
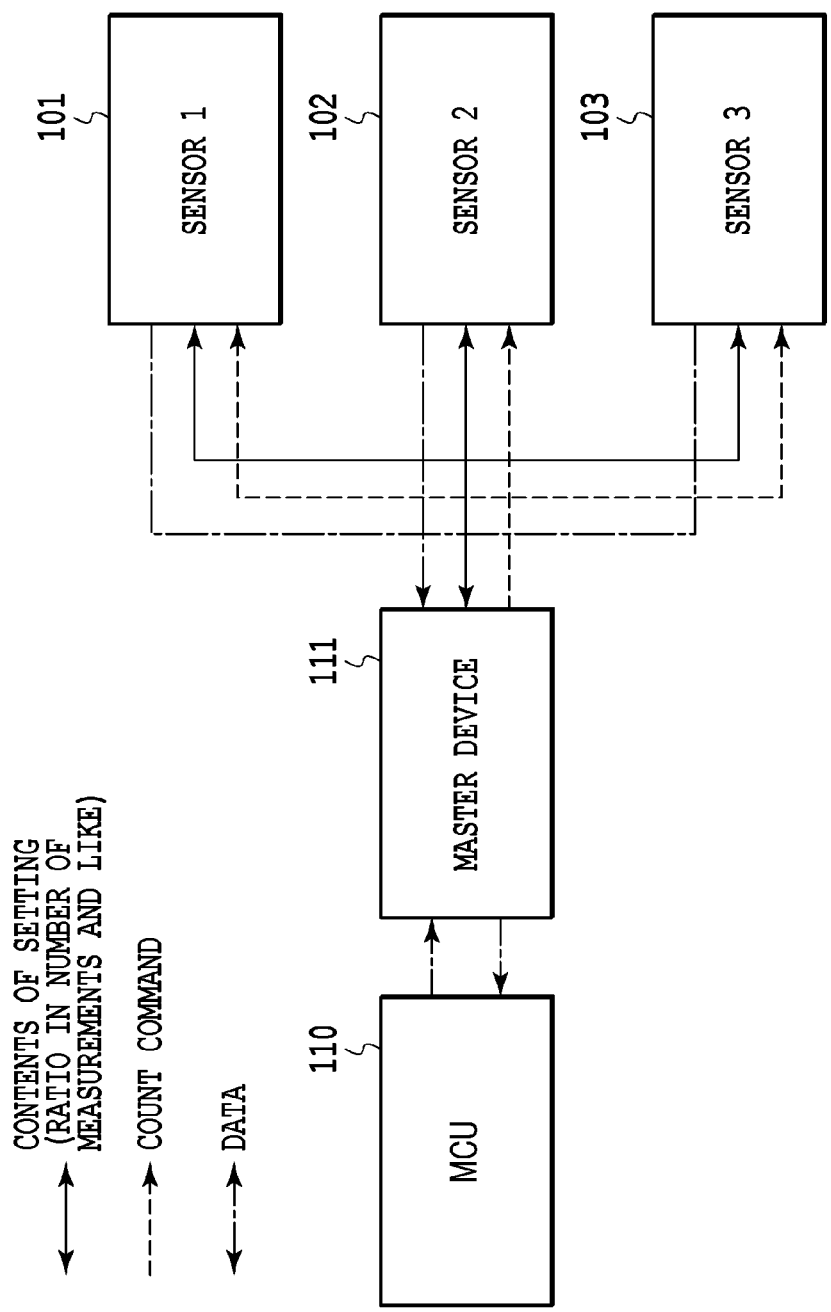
FIG. 28 is a block diagram for explaining a sensor data processing system using multiple sensor devices in Embodiment 6 of the present invention.

FIG. 28 is a block diagram for explaining a sensor data processing system using multiple sensor devices in Embodiment 6 of the present invention.

Embodiment 6 includes sensor devices 101, 102, and 103 having the functions of the present invention, a master device 111 connected to the sensor devices 101, 102 and 103, and a MCU 110 capable of transmitting and receiving data to and from the master device 111 and setting a ratio of measurement interval and the like. The master device 111 has: a function of transmitting information on the ratio of measurement interval and the like which is obtained from the MCU 110, to the sensor devices 101, 102, and 103; a function of generating a count command and transmitting the count command to the sensor devices 101, 102, and 103; a function of receiving data from the sensor devices 101, 102, and 103; and a function of transmitting and receiving data to and from the MCU 110.

Embodiment 7

Figure 29:
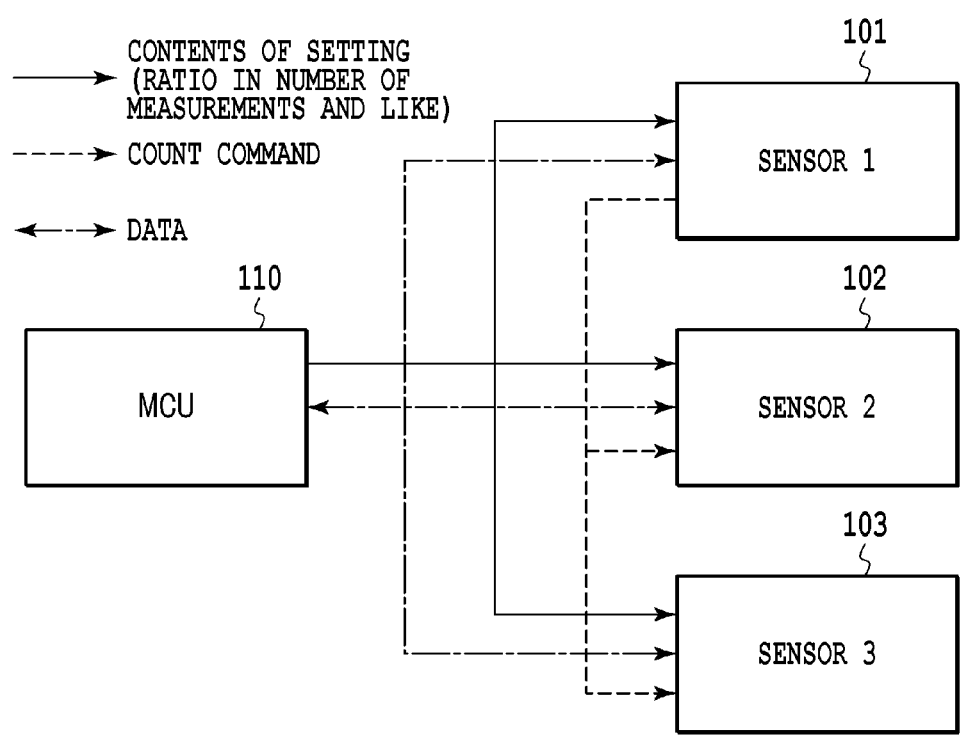
FIG. 29 is a block diagram for explaining a sensor data processing system using multiple sensor devices in Embodiment 7 of the present invention.

FIG. 29 is a block diagram for explaining a sensor data processing system using multiple sensor devices in Embodiment 7 of the present invention.

Embodiment 7 includes sensor devices 101, 102, and 103 having the functions of the present invention and a MCU 110 connected to the sensor devices 101, 102 and 103. The MCU 110 has: a function of setting a ratio of measurement interval and the like and transmitting the information on the setting to the sensor devices 101, 102, and 103; and a function of receiving data from the sensor devices 101, 102, and 103. However, the MCU 110 does not have a function of generating a count command. One of the sensor devices generates and outputs the count command.

FIG. 26 is a system configuration diagram which explains operations in the block diagram shown in FIG. 29. FIG. 26 is a system configuration diagram which shows a case where an I2C bus is used as a single count command input-output interface.

Specifically, in the embodiment, the sensor devices each have a common slave address for broadcast in addition to a unique slave addresses. Moreover, the MCU may also have this common slave address. First, in order to set the ratio of measurement interval in the respective sensor devices, the MCU 110 becomes an I2C master and starts data transmission in a write mode to each of the sensor devices by using the unique address of the sensor device.

Next, in order to give an instruction to one of the sensor devices to generate the count command, the MCU becomes the I2C master and starts data transmission in the write mode for the corresponding sensor device by using the unique address of this sensor device. Thereafter, the sensor device instructed to generate the count command becomes the I2C master by a timing managed by itself and starts data transmission in the write mode to the common broadcast address, as the count command. The sensor devices simultaneously receive the count command. Each of the sensor devices counts the number of the count commands transmitted from the sensor device being the I2C master and autonomously performs measurements at the set ratio of measurement interval.

In a case where the MCU 110 has the common broadcast address, the MCU 110 knows the number of receptions of the count commands and can thus know a timing at which data is to be collected from each of the sensor devices on the basis of the information on the number of receptions. Accordingly, the MCU 110 becomes the I2C master at an appropriate timing to correct the data and starts data transmission in a read mode to each of the sensor devices by using the address unique to the sensor device. This causes the designated sensor device to transmit measurement data to the MCU 110, and the MCU 110 can thereby collect measurement data.

Moreover, each of the sensor devices can notify measurement completion to the MCU 110. Setting an interrupt flag, the sensor device becoming the I2C master and starting data transmission in a MCU write mode, and the like are conceivable as means of notification. The MCU 110 fetches the data upon detecting the notification of measurement completion. Moreover, each of the sensor devices can automatically transmit the measurement data by becoming the I2C master and giving an instruction of data transmission in the MCU write mode.

FIG. 27 is a system configuration diagram which explains operations in the block diagram shown in FIG. 29. FIG. 27 is a system configuration diagram which shows a case where a SPI bus is used as a single count command input-output interface. In FIG. 27, a CPU, a slave 1, and a slave 2 each have a SPI interface and perform communication with each other via the SPI bus. The slave 1 and the slave 2 are set by the CPU.

In the embodiment, the sensor devices are connected in cascade to the MCU (CPU) 110 and a slave select signal line (SS) and a serial clock signal line (SCK) are shared by the respective sensor devices. In this configuration, setting registers and data registers of the respective sensor devices appear as one long shift register when viewed from the MCU 110.

First, in order to set the ratio of measurement interval in the respective sensor devices, the MCU 110 becomes a SPI master. At this time, a serial clock signal terminal (SCK) of the MCU 110 is an output terminal. Moreover, slave select signal terminals (SS) and serial clock signal terminals (SCK) of the sensor devices are all input terminals. The MCU 110 activates a slave select signal line (SS) shared by the sensor devices through a CTRL terminal. The slave select signal is also inputted to the slave select signal terminal (SS) of the MCU 110 itself. However, the operation of the MCU 110 is not affected at all because the MCU 110 is operating as the SPI master at this point.

In this state, the MCU 110 accesses a register chain in which the setting registers of all of the sensor devices are connected in cascade, by using a serial clock signal terminal and a serial output signal terminal, and sets the ratio measurement interval. Moreover, the MCU 110 sets an instruction for one of the sensor devices to generate the count command and sets the desired timing of transmission of the measurement data (specifies the number of counts before the transmission) and the desired number of pieces of measurement data to be transmitted.

After the operations up to this point are completed, the MCU 110 cancels the master state and sets itself to a slave mode. In a state from this point forward, the serial clock signal terminal (SCK) of the MCU 110 is an input terminal. Moreover, the sensor device set to generate the count command changes its slave select signal terminal (SS) and its serial clock signal terminal (SCK) to output terminals.

The sensor device set to generate the count command becomes the SPI master by a timing managed by itself and outputs the count command to the slave select signal line (SS). The count command is, for example, a falling edge of the slave select signal line (SS). This count command is simultaneously received by the sensor devices. Each of the sensor devices counts the number of the count commands and autonomously performs measurement at the set ratio of measurement interval.

Moreover, upon detecting the set timing of transmission of the measurement data, the sensor device set to generate the count command transmits a clock signal corresponding to the number of pieces of measurement data to be transmitted, to the serial clock signal line (SCK), with the slave select signal line (SS) being activated. The pieces of measurement data are thereby sequentially transferred to the MCU from the register chain in which the data registers of all of the sensor devices are connected in cascade, and the MCU can thus collect the desired measurement data.

In the SPI bus configuration in which the sensor devices are connected in cascade, data can be transmitted from the MCU 110 to the sensor devices at a timing at which data is transmitted from the sensor devices to the MCU 110. Accordingly, in a case where the MCU 110 desires to change the configuration of the measurement data, the MCU 110 can regain the authority of the SPI master from the sensor device by transmitting desired setting information.

Embodiment 8

Figure 30:
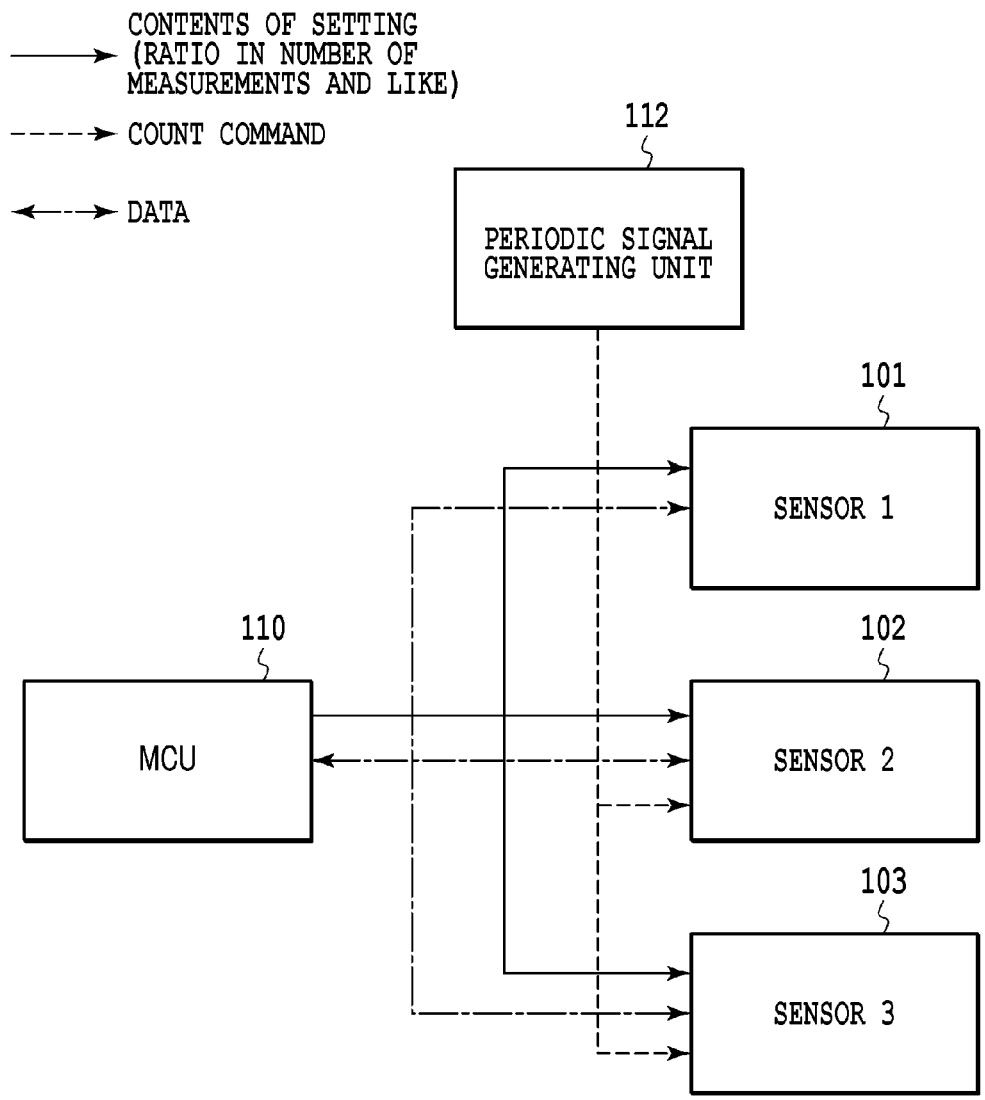
FIG. 30 is a block diagram for explaining a sensor data processing system using multiple sensor devices in Embodiment 8 of the present invention.

FIG. 30 is a block diagram for explaining a sensor data processing system using multiple sensor devices in Embodiment 8 of the present invention.

Embodiment 8 includes sensor devices 101, 102, and 103 having the functions of the present invention, a MCU 110 connected to the sensor devices 101, 102 and 103, and an external periodic-signal-generating-unit 112 for generating a count command. The periodic-signal-generating-unit 112 transmits the count command to the sensor devices 101, 102, and 103. The MCU 110 has: a function of setting a ratio of measurement interval and the like and transmitting the information on the setting to the sensor devices 101, 102, and 103; and a function of receiving data from the sensor devices 101, 102, and 103.

Embodiment 9

Figure 31:
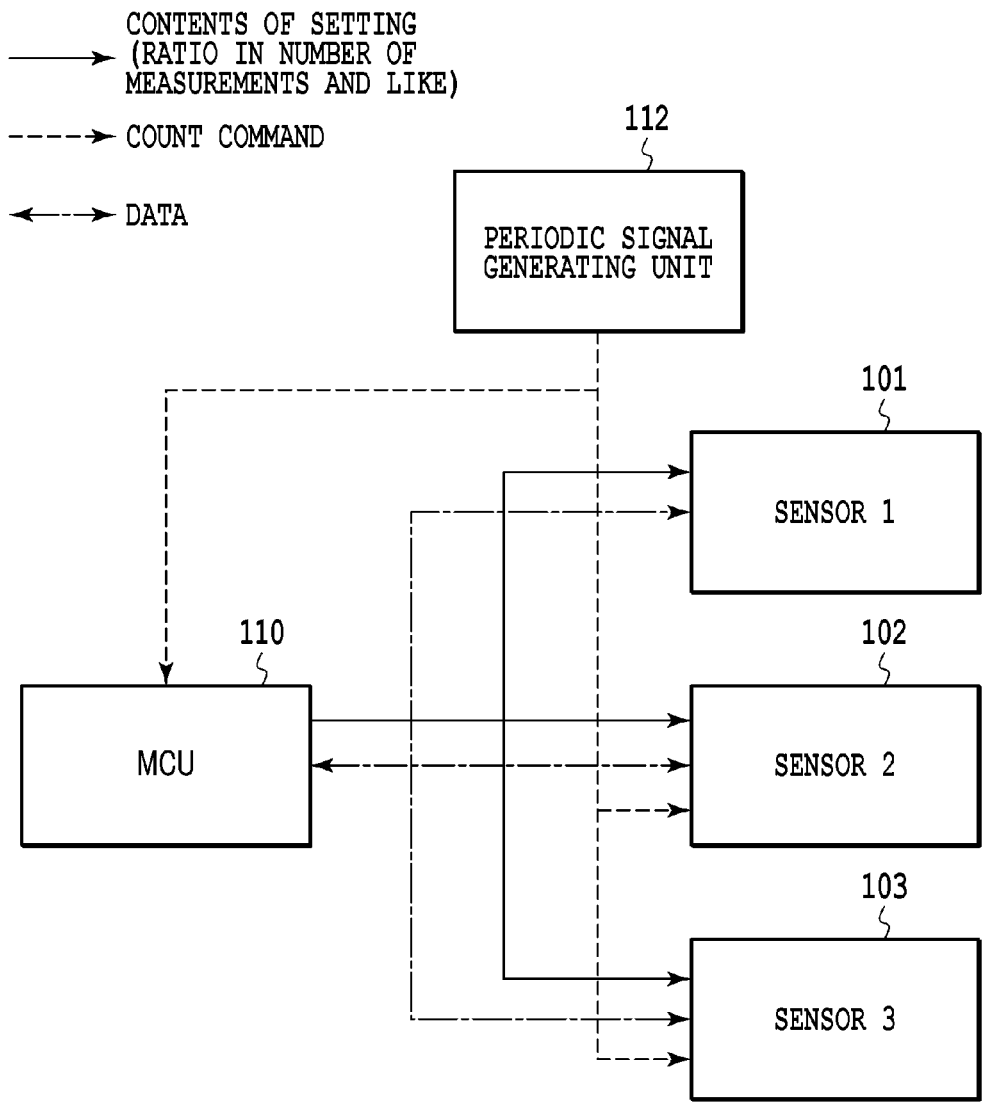
FIG. 31 is a block diagram for explaining a sensor data processing system using multiple sensor devices in Embodiment 9 of the present invention.

FIG. 31 is a block diagram for explaining a sensor data processing system using multiple sensor devices in Embodiment 9 of the present invention and shows another embodiment of Embodiment 8 shown in FIG. 30.

Embodiment 9 includes: sensor devices 101, 102, and 103 having the functions of the present invention, a MCU 110 connected to the sensor devices 101, 102 and 103, and an external periodic-signal-generating-unit 112 configured to generate a count command. The MCU 110 sets a ratio of measurement interval and transmits information on the setting to the sensor devices 101, 102, and 103. Lines for count command reception are provided and the count command is transmitted from the external periodic-signal-generating-unit 112 to the sensor devices 101, 102, and 103. The sensor devices 101, 102, and 103 and the MCU 110 receives the count command. Each of the sensor devices 101, 102, and 103 autonomously performs measurements at the set ratio of measurement interval according to the count command. The MCU 110 counts the number of received count commands and fetches data from each of the sensor devices 101, 102, and 103 when the number reaches a set number.

As described above, it is possible to provide the sensor data processing system using the sensor devices with sampling functionality which allow the ratio of measurement interval in the multiple sensor devices to be arbitrary set and to be held and which can autonomously perform measurements while holding the set ratio of measurement interval in the respective sensor devices.

The invention claimed is:

1. A sensor device with sampling functionality comprising:
   a counter for counting the number of count commands for performing measurements while maintaining among multiple sensor devices a ratio of measurement intervals;
   a ratio-of-measurement-intervals-holding-unit
   for holding a setting value of desired ratio of measurement intervals;
   a sampling-timing-generating-unit
   for generating sampling timing signal from count value of the counter and the setting value of the ratio of measurement intervals which value is held by the ratio-of-measurement-intervals-holding-unit, based on the comparison result between the count value and the setting value; and
   a sampling-unit
   for starting, according to the sampling timing signal generated by the sampling-timing-generating-unit, the sampling of detected signals of various types of information detected by detecting-unit.

2. The sensor device with sampling functionality according to claim 1, wherein a delay-time-holding-unit, which holds desired measurement start delay time, is connected to the sampling-timing-generating-unit so that the start of sampling in the sampling-unit triggered by the sampling timing signal is delayed.

3. The sensor device with sampling functionality according to claim 1, wherein the sensor device is equipped with:
   detecting-unit-operation-start-time-holding-unit for holding operation start time information of the detecting-unit; and
   detecting-unit-operation-controlling-unit for receiving the count value from the counter and the operation start time information of the detecting-unit from the detecting-unit-operation-start-time-holding-unit.

4. The sensor device with sampling functionality according to claim 1, wherein the sensor device is equipped with count-command-generating-unit for generating the count command, and
   when using the count command generated by the count-command-generating-unit, the sensor device is capable of outputting the count command to the outside while inputting the count command to the counter.

5. The sensor device with sampling functionality according to claim 4, wherein an interface for outputting the count command generated by the count-command-generating-unit to the outside and an interface for receiving the count command from the outside are a single interface.

6. The sensor device with sampling functionality according to claim 5, wherein the interface for outputting the count command generated by the count-command-generating-unit to the outside and the interface for receiving the count command from the outside are a single interface; and the single interface is an I2C bus.

7. The sensor device with sampling functionality according to claim 5, wherein the interface for outputting the count command generated by the count-command-generating-unit to the outside and the interface for receiving the count command from the outside are a single interface; and the single interface is a SPI bus.

8. The sensor device with sampling functionality according to claim 5, wherein the sensor device is switchable between an operation mode in which the count command generated by the count-command-generating-unit is inputted into the counter and another operation mode in which the count command received from the outside is inputted into the counter.

9. A sensor data processing system wherein,
the sensor device according to claim 1 and a sensor-data-processing-unit are combined, and
the sensor-data-processing-unit has functionalities of setting the ratio of measurement intervals, and transmitting information on the ratio of measurement intervals and the count command to the sensor devices; and functionality of receiving data from the sensor devices.

10. A sensor data processing system wherein,
the sensor device according to claim 1 and a sensor-data-processing-unit are combined, and
a master device connected to the sensor-data-processing-unit has functionalities of setting the ratio of measurement intervals, and transmitting information on the ratio of measurement intervals and the count command to the sensor devices; and functionality of receiving data from the sensor devices.

11. A sensor data processing system wherein,
the sensor device according to claim 1 and a sensor-data-processing-unit are combined,
the sensor-data-processing-unit has functionalities of setting the ratio of measurement intervals and the like, and transmitting information on the ratio of measurement intervals to the sensor devices; and functionality of receiving data from the sensor devices, and
one of the sensor devices generates and outputs the count command.

12. A sensor data processing system wherein,
the sensor device according to claim 1 and a sensor-data-processing-unit are combined,
the sensor data processing system comprises external periodic-signal-generating-unit for generating the count command,
the count command is transmitted from the periodic-signal-generating-unit to the sensor devices, and
the sensor-data-processing-unit has functionalities of setting the ratio of measurement intervals, and transmitting information on the ratio of measurement intervals to the sensor devices; and functionality of receiving data from the sensor devices.

13. A sensor data processing system wherein,
the sensor device according to claim 1 and a sensor-data-processing-unit are combined,
the sensor data processing system comprises an external periodic-signal-generating-unit for generating the count command,
the count command is transmitted from the periodic-signal-generating-unit to the sensor devices, and is received by the sensor devices and the sensor-data-processing-unit,
each sensor devices autonomously perform measurements according to the respective set ratio of measurement intervals by referring to the count command,
the sensor-data-processing-unit counts the number of the received count commands and obtains data from the sensor devices when the number of the received count commands reaches a set number.

* * * * *